(12) United States Patent
Xu

(10) Patent No.: US 10,186,223 B2
(45) Date of Patent: Jan. 22, 2019

(54) GOA CIRCUIT AND LIQUID CRYSTAL DISPLAY

(71) Applicant: Shenzhen China Star Optoelectronics Technology Co., Ltd., Shenzhen, Guangdong (CN)

(72) Inventor: Hongyuan Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 275 days.

(21) Appl. No.: 15/308,581

(22) PCT Filed: Aug. 10, 2016

(86) PCT No.: PCT/CN2016/094463
§ 371 (c)(1),
(2) Date: Nov. 2, 2016

(87) PCT Pub. No.: WO2018/014381
PCT Pub. Date: Jan. 25, 2018

(65) Prior Publication Data
US 2018/0190228 A1 Jul. 5, 2018

(30) Foreign Application Priority Data
Jul. 21, 2016 (CN) .......................... 2016 1 0587413

(51) Int. Cl.
*G09G 3/36* (2006.01)

(52) U.S. Cl.
CPC ............. *G09G 3/3677* (2013.01); *G09G 3/36* (2013.01); *G09G 2310/0291* (2013.01); *G09G 2310/08* (2013.01)

(58) Field of Classification Search
CPC ............. G09G 2310/08; G09G 3/3677; G09G 2310/0291
See application file for complete search history.

(56) References Cited

U.S. PATENT DOCUMENTS

2017/0236480 A1* 8/2017 Dai ..................... G09G 3/3677
345/213

* cited by examiner

*Primary Examiner* — Nelson Rosario
*Assistant Examiner* — Scott Au
(74) *Attorney, Agent, or Firm* — Andrew C. Cheng

(57) ABSTRACT

The present invention discloses a GOA circuit, comprising a plurality of GOA units which are cascade coupled, and the Nth stage GOA unit is employed to control charge to the Nth level scan line G(N), and the pull-down holding circuit of the Nth stage GOA unit comprises a Nth control circuit, a Nth holding circuit and a Nth shared circuit; the pull-down holding circuit of the (N+4)th stage GOA unit comprises a (N+4)th control circuit, a (N+4)th holding circuit and a Nth shared circuit; a first control end Q(N) of the Nth control circuit and a second control end receiving the first control signal regulates and controls a voltage level of the output end P(N) thereof; a first control end Q(N+4) of the (N+4)th control circuit and a second control end receiving the low frequency control signal regulates and controls a voltage level of the output end P(N+4) thereof.

20 Claims, 7 Drawing Sheets

GOA CIRCUIT AND LIQUID CRYSTAL DISPLAY

CROSS REFERENCE

This application claims the priority of Chinese Patent Application No. 201610587413.3, entitled "GOA circuit and liquid crystal display", filed on Jul. 21, 2016, the disclosure of which is incorporated herein by reference in its entirety.

FIELD OF THE INVENTION

The present invention relates to a liquid crystal display technology field, and more particularly to a GOA circuit and a liquid crystal display.

BACKGROUND OF THE INVENTION

The GOA (Gate Driver on Array) technology is a kind of skill which manufactures the Thin Film Transistor (TFT) gate scan drive circuit on the TFT array substrate to replace the drive chip manufactured by the external silicon chip. Because the GOA circuit can be directly manufactured around the panel, it can not only decrease the frame thickness of the Liquid Crystal Display (LCD) panel and simplify the manufacture process but product cost also can be reduced to promote the integration level of the liquid crystal panel.

The GOA circuit according to prior art generally comprises a plurality of GOA units which are cascade coupled, and the GOA unit of each stage comprises a pull-up control circuit, a pull-up circuit, a transfer circuit, a pull-down circuit, a bootstrap capacitor, a pull-down holding circuit and a Boast capacitor in charge of boosting voltage level. The pull-up control circuit is in charge of controlling the activation of the pull-up circuit, and generally coupled to the transfer signal or the Gate signal transmitted from the former stage GOA circuit; the pull-up circuit is mainly in charge of outputting the Clock signal to be the Gate signal; the pull-down circuit is in charge of rapidly pulling down the scan drive signal (i.e. the voltage level of the TFT gate) to be low voltage level, i.e. closing the Gate signal after outputting the scan drive signal; the pull-down holding circuit is mainly in charge of keeping the scan drive signal and the Gate signal (generally named as Q point) of the pull-up circuit in the close state (i.e. the negative voltage level), and generally, two pull-down holding modules alternately function; the bootstrap capacitor is in charge of the second boost to the voltage level of the Q point.

In prior art, the basic structure of the GOA circuit is to arrange the parts, such as the pull-up circuit, the pull-up control circuit of the aforesaid GOA unit in the same stage GOA unit, and particularly, the two pull-down holding circuits alternately function in the same stage GOA circuit. However, the pull-down holding circuits of the GOA units of all stages are the same and independent from one another, and the pull-down holding circuits of the GOA units of the adjacent two stages have no interaction and result in that the actual function efficiency of the circuit is lower. Besides, because the pull-down holding circuit of the GOA unit of each stage includes more TFT components, which does not only lead to the overlarge size of the entire GOA unit and increase of the design space occupied by the GOA circuit but also increase the circuit power consumption.

SUMMARY OF THE INVENTION

The embodiment of the present invention provides a GOA circuit and a liquid crystal display, which can achieve that the GOA circuits of every two stages share the pull-down holding circuit so that the TFT amount in the GOA circuit can be reduced to decrease the design space occupied by the GOA circuit.

First, the embodiment of the present invention provides a Gate Driver On Array (GOA) circuit, wherein the GOA circuit comprises a plurality of GOA units which are cascade coupled, and the Nth stage GOA unit is employed to control charge to the Nth level scan line G(N), and the (N+4)th stage GOA unit is employed to control charge to the (N+4)th level scan line G(N+4), wherein:

the Nth stage GOA unit comprises a Nth Pull-down Holding circuit; the (N+4)th stage GOA unit comprises a (N+4)th Pull-down Holding circuit; the Nth Pull-down Holding circuit comprises a Nth control circuit, a Nth holding circuit and a Nth shared circuit, which is shared with the (N+4)th Pull-down Holding circuit; the (N+4)th Pull-down Holding circuit comprises a (N+4)th control circuit, a (N+4)th holding circuit and the Nth shared circuit, which is shared with the Nth Pull-down Holding circuit;

the Nth control circuit comprises a first control end Q(N) and a second control end, and the second control end of the Nth control circuit receives a first low frequency control signal, and the first control end Q(N) of the Nth control circuit and the first low frequency control signal are employed to control a voltage level of an output end P(N) of the Nth control circuit to be a high voltage level or a low voltage level; the Nth holding circuit is electrically coupled to the output end P(N), the first control end Q(N) of the Nth control circuit and the Nth level scan line G(N), and is employed to keep voltage levels of the first control end Q(N) of the Nth control circuit and the Nth level scan line G(N) to be low voltage levels as the output end P(N) of the Nth control circuit is the high voltage level;

the (N+4)th control circuit comprises a first control end Q(N+4) and a second control end, and the second control end of the (N+4)th control circuit receives a second low frequency control signal, and the first control end Q(N+4) of the (N+4)th control circuit and the second low frequency control signal are employed to control an output end P(N+4) of the (N+4)th control circuit to be a high voltage level or a low voltage level; the (N+4)th holding circuit is electrically coupled to the output end P(N+4), the first control end Q(N+4) of the (N+4)th control circuit and the (N+4)th level scan line G(N+4), and is employed to keep voltage levels of the first control end Q(N+4) of the (N+4)th control circuit and the (N+4)th level scan line G(N+4) to be low voltage levels as the output end P(N+4) of the (N+4)th control circuit is the high voltage level; wherein the first low frequency control signal and the second low frequency control signal are inverse in phase;

as the output end P(N) of the Nth control circuit is the high voltage level, and the output end P(N+4) of the (N+4)th control circuit is the high voltage level, the Nth shared circuit works to share the voltage levels of the first control end Q(N) of the Nth control circuit and the first control end Q(N+4) of the (N+4)th control circuit both kept to be the low voltage levels, and the Nth shared circuit shares the voltage levels of the Nth level scan line G(N) and the voltage level of the (N+4)th level scan line G(N+4) both kept to be the low voltage levels.

As the output end P(N) of the Nth control circuit is the low voltage level, or the output end P(N+4) of the (N+4)th control circuit is the low voltage level, the Nth shared circuit stops working.

The shared circuit comprises a sixty first transistor, a sixty second transistor, a sixty third transistor and a sixty fourth transistor, wherein:

a gate of the sixty first transistor and a gate of the sixty third transistor are electrically coupled to the output end P(N) of the Nth control circuit, and a source of the sixty first transistor is electrically coupled to the first control end Q(N) of the Nth control circuit, and a drain of the sixty first transistor is electrically coupled to a drain of the sixty second transistor; a source of the sixty second transistor is electrically coupled to the first control end Q(N+4) of the (N+4)th control circuit, and a gate of the sixty second transistor and a gate of the sixty fourth transistor are electrically coupled to the output end P(N+4) of the (N+4)th control circuit; a source of the sixty third transistor is electrically coupled to the (N+4)th level scan line G(N+4), and a drain of the sixty third transistor is electrically coupled to a drain of the sixty fourth transistor, and a drain of the sixty fourth transistor is electrically coupled to the Nth level scan line G(N).

The Nth control circuit comprises a fifty first transistor, a fifty second transistor, a fifty third transistor and a fifty fourth transistor, wherein:

a gate of the fifty first transistor, a drain of the fifty first transistor, a drain of the fifty third transistor are electrically coupled to the second control end of the Nth control circuit, and a source of the fifty first transistor is electrically coupled to a drain of the fifty second transistor and a gate of the fifty third transistor, and a gate of the fifty second transistor is electrically coupled to the first control end Q(N) of the Nth control circuit, and a source of the fifty third transistor is electrically coupled to a drain of the fifty fourth transistor and the output end P(N) of the Nth control circuit, and a source of the fifty second transistor and a source of the fifty fourth transistor are inputted with a direct current low voltage;

as the first control end Q(N) of the Nth control circuit is the low voltage level, and if the second control end of the Nth control circuit is the high voltage level, the output end P(N) of the Nth control circuit is the high voltage level;

as the first control end Q(N) of the Nth control circuit is the low voltage level, and if the second control end of the Nth control circuit is changed from the high voltage level to the low voltage level, the output end P(N) of the Nth control circuit is the high voltage level.

The Nth holding circuit comprises a thirty second transistor and a forty second transistor, wherein:

a gate of the thirty second transistor and a gate of the forty second transistor are electrically coupled to the output end P(N) of the Nth control circuit, and a drain of the thirty second transistor is electrically coupled to the Nth level scan line G(N), and a drain of the forty second transistor is electrically coupled to the first control end Q(N) of the Nth control circuit, and a source of the thirty second transistor and a source of the forty second transistor are inputted with the direct current low voltage;

as the output end P(N) of the Nth control circuit is the high voltage level, the Nth level scan line G(N) and the first control end Q(N) of the Nth control circuit are kept to be the low voltage levels.

The (N+4)th control circuit comprises a fifty fifth transistor, a fifty sixth transistor, a fifty seventh transistor and a fifty eighth transistor, wherein:

a gate of the fifty fifth transistor, a drain of the fifty fifth transistor, a drain of the fifty seventh transistor are electrically coupled to the second control end of the (N+4)th control circuit, and a source of the fifty fifth transistor is electrically coupled to a drain of the fifty sixth transistor and a gate of the fifty seventh transistor, and a gate of the fifty sixth transistor is electrically coupled to the first control end Q(N+4) of the (N+4)th control circuit, and a source of the fifty seventh transistor is electrically coupled to a drain of the fifty eighth transistor and the output end P(N+4) of the (N+4)th control circuit, and a source of the fifty sixth transistor and a source of the fifty eighth transistor are inputted with the direct current low voltage;

as the first control end Q(N+4) of the (N+4)th control circuit is the low voltage level, and if the second control end of the (N+4)th control circuit is the high voltage level, the output end P(N+4) of the (N+4)th control circuit is the high voltage level;

as the first control end Q(N+4) of the (N+4)th control circuit is the low voltage level, and if the second control end of the (N+4)th control circuit is changed from the high voltage level to the low voltage level, the output end P(N+4) of the (N+4)th control circuit is the high voltage level.

The (N+4)th control circuit comprises a fifty fifth transistor, a fifty sixth transistor, a fifty seventh transistor and a fifty eighth transistor, wherein:

a gate of the fifty fifth transistor, a drain of the fifty fifth transistor, a drain of the fifty seventh transistor are electrically coupled to the second control end of the (N+4)th control circuit, and a source of the fifty fifth transistor is electrically coupled to a drain of the fifty sixth transistor and a gate of the fifty seventh transistor, and a gate of the fifty sixth transistor is electrically coupled to the first control end Q(N+4) of the (N+4)th control circuit, and a source of the fifty seventh transistor is electrically coupled to a drain of the fifty eighth transistor and the output end P(N+4) of the (N+4)th control circuit, and a source of the fifty sixth transistor and a source of the fifty eighth transistor are inputted with the direct current low voltage;

as the first control end Q(N+4) of the (N+4)th control circuit is the low voltage level, and if the second control end of the (N+4)th control circuit is the high voltage level, the output end P(N+4) of the (N+4)th control circuit is the high voltage level;

as the first control end Q(N+4) of the (N+4)th control circuit is the low voltage level, and if the second control end of the (N+4)th control circuit is changed from the high voltage level to the low voltage level, the output end P(N+4) of the (N+4)th control circuit is the high voltage level.

The (N+4) holding circuit comprises a thirty third transistor and a forty third transistor, wherein:

a gate of the thirty third transistor and a gate of the forty third transistor are electrically coupled to the output end P(N+4) of the (N+4)th control circuit, and a drain of the thirty third transistor is electrically coupled to the (N+4)th level scan line G(N+4), and a drain of the forty third transistor is electrically coupled to the first control end Q(N+4) of the (N+4)th control circuit, and a source of the thirty third transistor and a source of the forty third transistor are inputted with the direct current low voltage;

as the output end P(N+4) of the (N+4)th control circuit is the high voltage level, the (N+4)th level scan line G(N+4) and the first control end Q(N+4) of the (N+4)th control circuit are kept to be the low voltage levels.

The Nth stage GOA unit further comprises a Nth pull-up control circuit, a Nth pull-up circuit, a Nth transfer circuit, a Nth pull-down circuit and a Nth bootstrap capacitor, wherein:

the Nth pull-up control circuit is electrically coupled to the first control end Q(N) of the Nth control circuit, and the Nth pull-up control circuit receives a transfer signal ST(N−2) generated by the (N−2)th stage GOA unit and the (N−2)th level scan line G(N−2);

the Nth pull-up circuit and the Nth transfer circuit are electrically coupled to the first control end Q(N) of the Nth control circuit, respectively, and the Nth pull-up circuit is electrically coupled to the Nth level scan line G(N), and the Nth transfer circuit outputs a transfer signal ST(N) generated by the Nth stage GOA unit, and both the Nth pull-up circuit and the Nth transfer circuit receives a clock signal corresponding to the Nth stage GOA unit;

one end of the Nth bootstrap capacitor is electrically coupled to the first control end Q(N) of the Nth control circuit, and the other end is electrically coupled to the Nth level scan line G(N);

the Nth pull-down circuit is electrically coupled to the first control end Q(N) of the Nth control circuit and the Nth level scan line G(N), respectively, and the Nth pull-down circuit further receives the direct current low voltage, and the Nth pull-down circuit is further coupled to the (N+2)th level scan line G(N+2).

In the (N+4)th stage GOA unit: the (N+4)th stage GOA unit further comprises a (N+4)th pull-up control circuit, a (N+4)th pull-up circuit, a (N+4)th transfer circuit, a (N+4)th pull-down circuit and a (N+4)th bootstrap capacitor;

the (N+4)th pull-up control circuit receives a transfer signal ST(N+2) generated by the (N+2)th stage GOA unit and the (N+2)th level scan line G(N+2), and the (N+4)th pull-up control circuit is electrically coupled to the first control end Q(N+4) of the (N+4)th control circuit;

the (N+4)th pull-up circuit and the (N+4)th transfer circuit are electrically coupled to the first control end Q(N+4) of the (N+4)th control circuit, respectively, and the (N+4)th pull-up circuit is electrically coupled to the (N+4)th level scan line G(N+4), and the (N+4)th transfer circuit outputs a transfer signal ST(N+4) generated by the (N+4)th stage GOA unit, and both the (N+4)th pull-up circuit and the (N+4)th transfer circuit receives a clock signal corresponding to the (N+4)th stage GOA unit;

one end of the (N+4)th bootstrap capacitor is electrically coupled to the (N+4)th gate signal point Q(N+4), and the other end is electrically coupled to the (N+4)th level scan line G(N+4);

the (N+4)th pull-down circuit is electrically coupled to the first control end Q(N+4) of the (N+4)th control circuit and the (N+4)th level scan line G(N+4), respectively, and the (N+4)th pull-down circuit further receives the direct current low voltage, and the (N+4)th pull-down circuit is further coupled to the (N+6)th level scan line G(N+6).

The clock signal received by each GOA unit is one of a first clock signal, a second clock signal, a third clock signal and a fourth clock signal, wherein the clock signal received by the Nth stage GOA unit and the clock signal received by the (N+4)th stage GOA unit are the same.

Periods of the first low frequency control signal and the second low frequency control signal are twice of a period of the clock signal received by each GOA unit.

In the first stage and the second stage GOA units, the pull-up control circuit receives a scan start signal; in the last stage and the next to last stage GOA units, the pull-down circuit receives the scan start signal.

Second, the embodiment of the present invention further provides a liquid crystal display including the aforesaid GOA circuit.

In the GOA circuit provided by the embodiment of the present invention, the Nth Pull-down Holding circuit of the Nth stage GOA unit comprises a Nth control circuit, a Nth holding circuit and a Nth shared circuit, which is shared with the (N+4)th Pull-down Holding circuit; the (N+4)th Pull-down Holding circuit of the (N+4)th stage GOA unit comprises a (N+4)th control circuit, a (N+4)th holding circuit and the Nth shared circuit, which is shared with the Nth Pull-down Holding circuit; the first low frequency control signal LC1 received by the first control end Q(N) and the second control end of the Nth control circuit can control the voltage level of the output end P(N) of the Nth control circuit; the second low frequency control signal LC2 received by the first control end Q(N+4) and the second control end of the (N+4)th control circuit can control the voltage level of the output end P(N+4) of the (N+4)th control circuit; as the output end P(N) of the Nth control circuit and the output end P(N+4) of the (N+4)th control circuit are both the high voltage levels, the Nth shared circuit works to share the voltage levels of the first control end Q(N) of the Nth control circuit and the first control end Q(N+4) of the (N+4)th control circuit, and to share the voltage levels of the Nth level scan line G(N) and the voltage level of the (N+4)th level scan line G(N+4) so that the Nth stage GOA unit and the (N+4)th stage GOA unit are alternately pulled down by the Nth pull-down Holding circuit and the (N+4)th pull-down Holding circuit to promote the actual function efficiency of the GOA circuit. Besides, with the shared circuit between the Nth stage GOA unit and the (N+4)th stage GOA unit, the thin film transistor amount in the GOA circuit also can be reduced to decrease the design space occupied by the GOA circuit.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

For better explaining the technical solution and the effect of the present invention, the present invention will be further described in detail with the accompanying drawings in the specific embodiments. It is clear that the described embodiments are part of embodiments of the present application, but not all embodiments. Based on the embodiments of the present invention, all other embodiments to those of ordinary skill in the premise of no creative efforts obtained, should be considered within the scope of protection of the present invention.

Besides, the following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

In the description of the invention, which needs explanation is that the term "installation", "connected", "connection" should be broadly understood unless those are clearly defined and limited, otherwise, For example, those can be a fixed connection, a detachable connection, or an integral connection; those can be a mechanical connection, or an electrical connection; those can be a direct connection, or an indirect connection with an intermediary, which may be an internal connection of two elements. To those of ordinary skill in the art, the specific meaning of the above terminology in the present invention can be understood in the specific circumstances.

Besides, in the description of the present invention, unless with being indicated otherwise, "plurality" means two or more. In the present specification, the term "process" encompasses an independent process, as well as a process that cannot be clearly distinguished from another process but yet achieves the expected effect of the process of interest. Moreover, in the present specification, any numerical range expressed herein using "to" refers to a range including the numerical values before and after "to" as the minimum and maximum values, respectively. In figures, the same reference numbers will be used to refer to the same or like parts.

The embodiment of the present invention provides a GOA circuit and a liquid crystal display, which can achieve that the GOA circuits of every two stages share the pull-down holding circuit and the actual function efficiency of the circuit is lower so that the TFT amount in the GOA circuit can be reduced to decrease the design space occupied by the GOA circuit. The detail descriptions are respectively introduced below.

Figure 1:
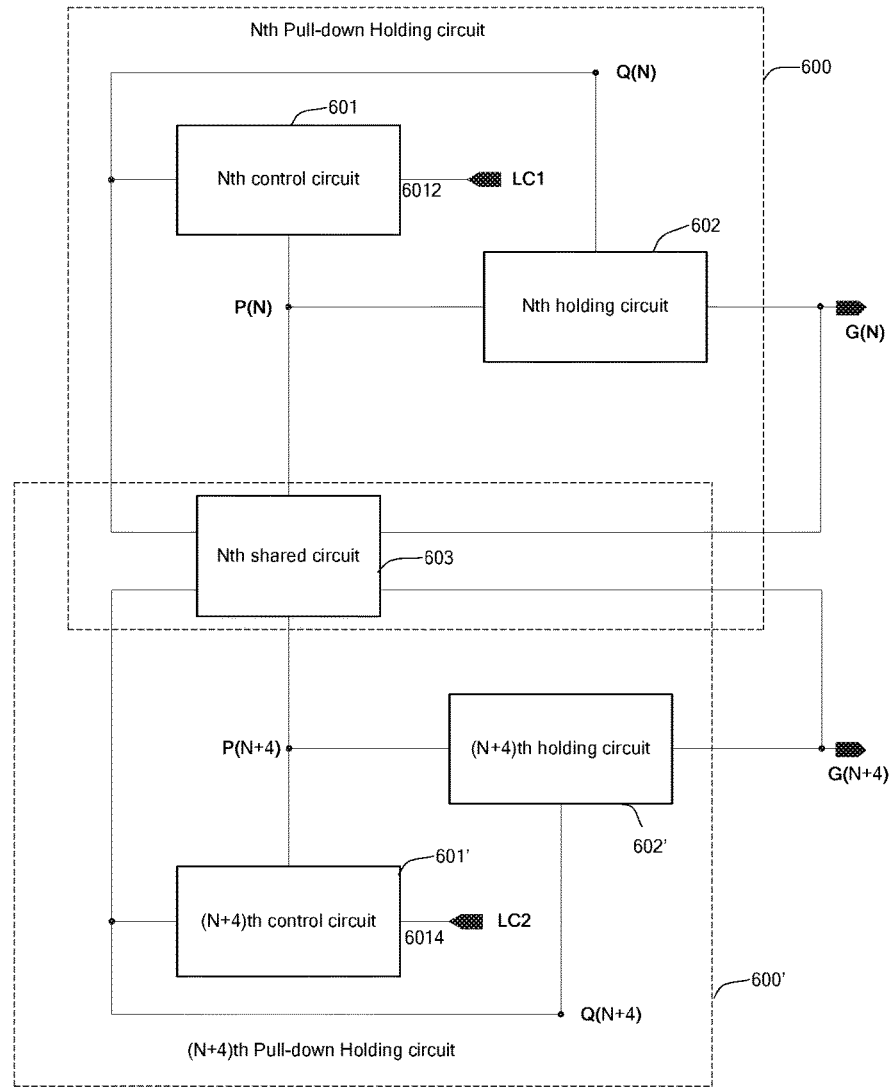
FIG. 1 is a diagram of a GOA circuit disclosed by the embodiment of the present invention.

Please refer to FIG. 1. FIG. 1 is a diagram of an array substrate row drive GOA circuit disclosed by the embodiment of the present invention.

In this embodiment, the GOA circuit comprises a plurality of GOA units which are cascade coupled (for instance, the first stage GOA unit, the second stage GOA unit . . . the Nth stage GOA unit, the N+1th stage GOA unit, the N+4th stage GOA unit, wherein N is an integer which is larger than or equal to 1), and the GOA unit of each stage corresponds to one row of Thin Film Transistors (TFT). The gate voltage of TFTs of each row can be provided by the GOA circuit. The Nth stage GOA unit is employed to control charge to the Nth level scan line (G(N)), and the (N+4)th stage GOA unit is employed to control charge to the (N+4)th level scan line G(N+4). As the charge to the same row is accomplished, the GOA circuit closes the scan drive signal of the row, and then outputs the start signal to activate the TFTs of the next row, and charges the TFTs of the row. So in order and until the charge to the TFTs corresponded with the GOA unit of the last stage is accomplished.

The Nth stage GOA unit comprises a Nth Pull-down Holding circuit 600; the (N+4)th stage GOA unit comprises a (N+4)th Pull-down Holding circuit 600'; the Nth Pull-down Holding circuit 600 comprises a Nth control circuit 601, a Nth holding circuit 602 and a Nth shared circuit 603, which is shared with the Nth Pull-down Holding circuit 600 and the (N+4)th Pull-down Holding circuit 600'; the (N+4)th Pull-down Holding circuit 600' comprises a (N+4)th control circuit 601', a (N+4)th holding circuit 602' and the Nth shared circuit 603, which is shared with the (N+4)th Pull-down Holding circuit 600' and the Nth Pull-down Holding circuit 600; N is an positive integer.

The Nth control circuit 601 comprises a first control end Q(N) and a second control end 6012, and the second control end 6012 of the Nth control circuit 601 receives a first low frequency control signal LC1, and the first control end Q(N) of the Nth control circuit 601 and the first low frequency control signal LC1 are employed to control a voltage level of an output end P(N) of the Nth control circuit 601 to be a high voltage level or a low voltage level; the Nth holding circuit 602 is electrically coupled to the output end P(N), the first control end Q(N) of the Nth control circuit 601 and the Nth level scan line G(N), and is employed to keep voltage levels of the first control end Q(N) of the Nth control circuit 601 and the Nth level scan line G(N) to be low voltage levels as the output end P(N) of the Nth control circuit 601 is the high voltage level.

The (N+4)th control circuit 601' comprises a first control end Q(N+4) and a second control end 6014, and the second control end 6014 of the (N+4)th control circuit 601' receives a second low frequency control signal LC2, and the first control end Q(N+4) of the (N+4)th control circuit 601' and the second low frequency control signal LC2 are employed to control an output end P(N+4) of the (N+4)th control circuit 601' to be a high voltage level or a low voltage level; the (N+4)th holding circuit 602' is electrically coupled to the output end P(N+4), the first control end Q(N+4) of the (N+4)th control circuit 601' and the (N+4)th level scan line G(N+4), and is employed to keep voltage levels of the first control end Q(N+4) of the (N+4)th control circuit 601' and the (N+4)th level scan line G(N+4) to be low voltage levels as the output end P(N+4) of the (N+4)th control circuit 601' is the high voltage level; wherein the first low frequency control signal LC1 and the second low frequency control signal LC2 are inverse in phase;

as the output end P(N) of the Nth control circuit 601 is the high voltage level, and the output end P(N+4) of the (N+4)th control circuit 601' is the high voltage level, the Nth shared circuit 603 works to share the voltage levels of the first control end Q(N) of the Nth control circuit 601 and the first control end Q(N+4) of the (N+4)th control circuit 601' both kept to be the low voltage levels, and the Nth shared circuit 603 shares the voltage levels of the Nth level scan line G(N) and the voltage level of the (N+4)th level scan line G(N+4) both kept to be the low voltage levels.

As the output end P(N) of the Nth control circuit 601 is the low voltage level, or the output end P(N+4) of the (N+4)th control circuit 601' is the low voltage level, the Nth shared circuit 603 stops working. The Nth shared circuit 603 is equivalent to an AND gate circuit.

In the circuit structure described in FIG. 1, the Nth Pull-down Holding circuit 600 of the Nth stage GOA unit comprises a Nth control circuit 601, a Nth holding circuit 602 and a Nth shared circuit 603, which is shared with the Nth Pull-down Holding circuit 600 and the (N+4)th Pull-down Holding circuit 600'; the (N+4)th Pull-down Holding circuit 600' of the (N+4)th stage GOA unit comprises a (N+4)th control circuit 601', a (N+4)th holding circuit 602' and the Nth shared circuit 603, which is shared with the (N+4)th Pull-down Holding circuit 600' and the Nth Pull-down Holding circuit 600; the first low frequency control signal LC1 received by the first control end Q(N) and the second control end 6012 of the Nth control circuit 601 can control the voltage level of the output end P(N) of the Nth control circuit 601; the second low frequency control signal LC2 received by the first control end Q(N+4) and the second control end 6014' of the (N+4)th control circuit 601' can control the voltage level of the output end P(N+4) of the (N+4)th control circuit 601'; as the output end P(N) of the Nth control circuit 601 and the output end P(N+4) of the (N+4)th control circuit 601' are both the high voltage levels, the Nth shared circuit 603 works to share the voltage levels of the first control end Q(N) of the Nth control circuit 601 and the first control end Q(N+4) of the (N+4)th control circuit 601', and to share the voltage levels of the Nth level scan line G(N) and the voltage level of the (N+4)th level scan line G(N+4) so that the Nth stage GOA unit and the (N+4)th stage GOA unit are alternately pulled down by the Nth pull-down Holding circuit 600 and the (N+4)th pull-down Holding circuit 600' to promote the actual function efficiency of the GOA circuit.

Figure 2:
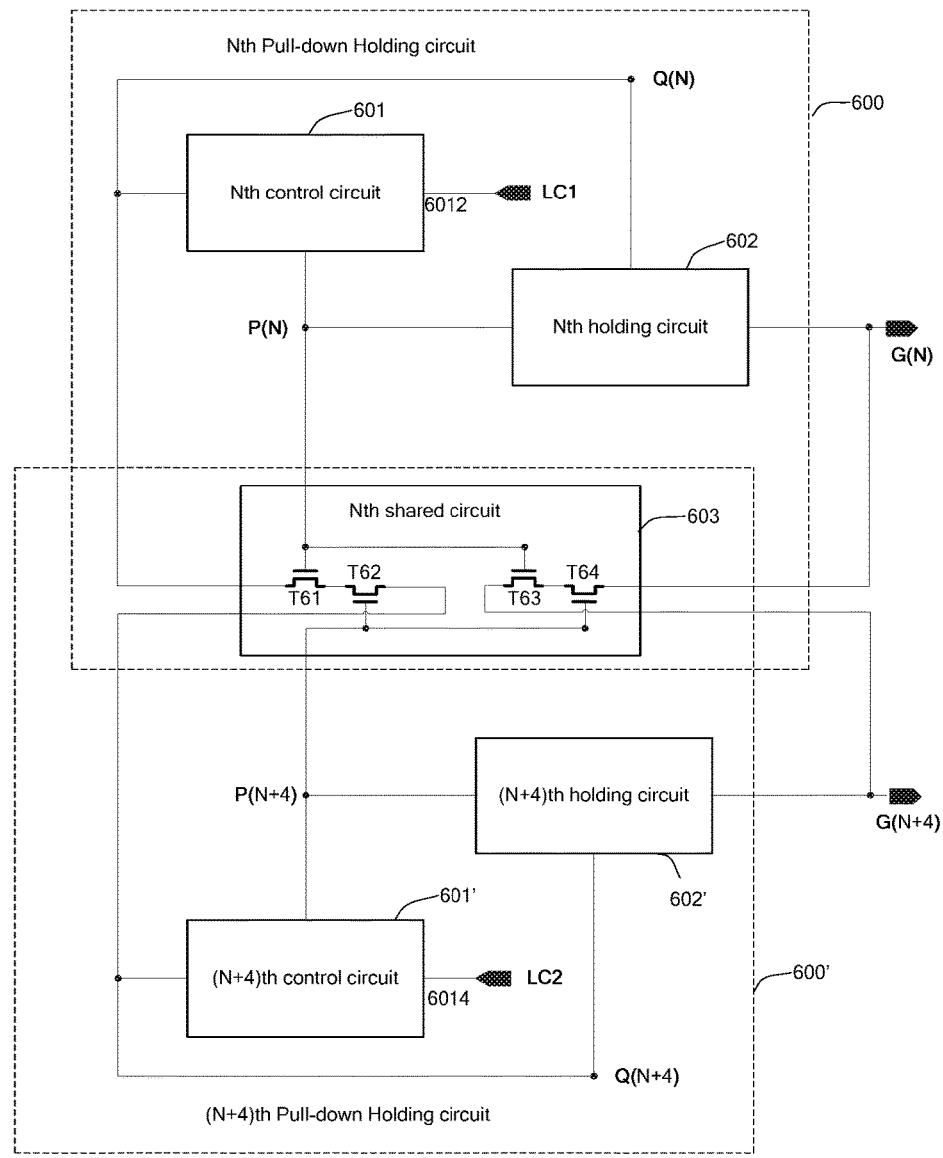
FIG. 2 is a diagram of another GOA circuit disclosed by the embodiment of the present invention.

Please refer to FIG. 2. FIG. 2 is a diagram of another GOA circuit disclosed by the embodiment of the present invention.

As shown in FIG. 2, the GOA circuit shown in this embodiment has the same circuit structure and the entire assembly as the GOA circuit shown in FIG. 1. The GOA circuit comprises a plurality of GOA units which are cascade coupled, and the GOA unit of each stage corresponds to one row of Thin Film Transistors. The Nth stage GOA unit comprises a Nth Pull-down Holding circuit 600; the (N+4)th stage GOA unit comprises a (N+4)th Pull-down Holding circuit 600'; the Nth Pull-down Holding circuit 600 comprises a Nth control circuit 601, a Nth holding circuit 602 and a Nth shared circuit 603, which is shared with the Nth Pull-down Holding circuit 600 and the (N+4)th Pull-down Holding circuit 600'; the (N+4)th Pull-down Holding circuit 600' comprises a (N+4)th control circuit 601', a (N+4)th holding circuit 602' and the Nth shared circuit 603, which is shared with the (N+4)th Pull-down Holding circuit 600' and the Nth Pull-down Holding circuit 600; the detail can be referred to the aforementioned description of the GOA circuit shown in FIG. 1, and the repeated description is omitted here.

Furthermore, the difference is that in the GOA circuit described in this embodiment, the shared circuit 603 comprises a sixty first transistor T61, a sixty second transistor T62, a sixty third transistor T63 and a sixty fourth transistor T64, wherein:

a gate of the sixty first transistor T61 and a gate of the sixty third transistor T63 are electrically coupled to the output end P(N) of the Nth control circuit 601, and a source of the sixty first transistor T61 is electrically coupled to the first control end Q(N) of the Nth control circuit 601, and a drain of the sixty first transistor T61 is electrically coupled to a drain of the sixty second transistor T62; a source of the sixty second transistor T62 is electrically coupled to the first control end Q(N+4) of the (N+4)th control circuit 601', and a gate of the sixty second transistor T62 and a gate of the sixty fourth transistor T64 are electrically coupled to the output end P(N+4) of the (N+4)th control circuit 601'; a source of the sixty third transistor T63 is electrically coupled to the (N+4)th level scan line G(N+4), and a drain of the sixty third transistor T63 is electrically coupled to a drain of the sixty fourth transistor T64, and a drain of the sixty fourth transistor T64 is electrically coupled to the Nth level scan line G(N). The shared circuit 603 is equivalent to an AND gate circuit. Only as both the output end P(N) of the Nth control circuit 601 and the output end P(N+4) of the (N+4)th control circuit 601' are high voltage levels, the Nth shared circuit 603 works.

Figure 3:
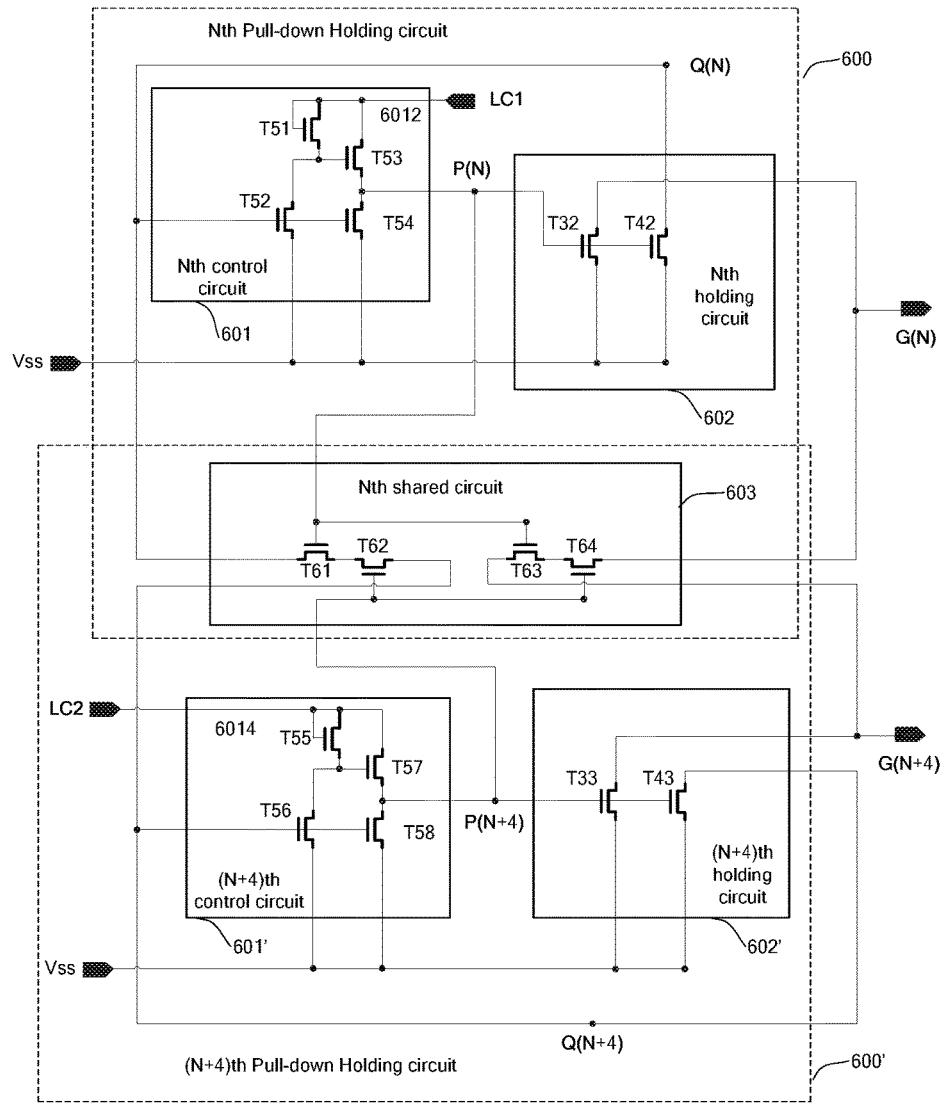
FIG. 3 is a diagram of another GOA circuit disclosed by the embodiment of the present invention.

Please refer to FIG. 3. FIG. 3 is a diagram of another GOA circuit disclosed by the embodiment of the present invention. As shown in FIG. 3, the GOA circuit shown in this embodiment has the same circuit structure and the entire assembly as the GOA circuits shown in FIG. 1 and FIG. 2. The detail can be referred to the aforementioned description of the GOA circuits shown in FIG. 1 and FIG. 2, and the repeated description is omitted here. Furthermore, the difference is that in the GOA circuit described in this embodiment, the Nth control circuit 601 comprises a fifty first transistor T51, a fifty second transistor T52, a fifty third transistor T53 and a fifty fourth transistor T54, wherein:

a gate of the fifty first transistor T51, a drain of the fifty first transistor T51, a drain of the fifty third transistor T53 are electrically coupled to the second control end 6012 of the Nth control circuit 601, i.e. receiving the first low frequency control signal LC1 and a source of the fifty first transistor T51 is electrically coupled to a drain of the fifty second transistor T52 and a gate of the fifty third transistor T53, and a gate of the fifty second transistor T52 is electrically coupled to the first control end Q(N) of the Nth control circuit 601, and a source of the fifty third transistor T53 is electrically coupled to a drain of the fifty fourth transistor T54 and the output end P(N) of the Nth control circuit 601, and a source of the fifty second transistor T52 and a source of the fifty fourth transistor T54 are inputted with a direct current low voltage Vss.

As the first control end Q(N) of the Nth control circuit 601 is the high voltage level, the fifty second transistor T52 and a source of the fifty fourth transistor T54 are activated to pull down the output end P(N) of the Nth control circuit 601 to be the low voltage level.

As the first control end Q(N) of the Nth control circuit 601 is the low voltage level, and if the first low frequency control signal LC1 received by the second control end 6012 of the Nth control circuit 601 is the high voltage level, the fifty first transistor T51 and the fifty third transistor T53 are activated, and the output end P(N) of the Nth control circuit 601 is the high voltage level.

As the first control end Q(N) of the Nth control circuit 601 is the low voltage level, and if the first low frequency control signal LC1 received by the second control end 6012 of the Nth control circuit 601 is changed from the high voltage level to the low voltage level, and all the fifty first transistor T51, the fifty second transistor T52, the fifty third transistor T53 and the fifty fourth transistor T54 are deactivated, because the first low frequency control signal LC1 in the previous period is at the high voltage level and the output end P(N) of the Nth control circuit 601 is the high voltage level, the output end P(N) of the Nth control circuit 601 is kept to be the voltage level state of the previous period, i.e. P(N) is the high voltage level.

Furthermore, the Nth holding circuit 602 comprises a thirty second transistor T32 and a forty second transistor T42, wherein:

a gate of the thirty second transistor T32 and a gate of the forty second transistor T42 are electrically coupled to the output end P(N) of the Nth control circuit 601, and a drain of the thirty second transistor T32 is electrically coupled to the Nth level scan line G(N), and a drain of the forty second transistor T42 is electrically coupled to the first control end Q(N) of the Nth control circuit 601, and a source of the thirty second transistor T32 and a source of the forty second transistor T42 are inputted with the direct current low voltage Vss;

as the output end P(N) of the Nth control circuit 601 is the high voltage level, the thirty second transistor T32 and the forty second transistor T42 are activated to keep the Nth level scan line G(N) and the first control end Q(N) of the Nth control circuit 601 to be the low voltage levels.

Furthermore, the (N+4)th control circuit 601' comprises a fifty fifth transistor T55, a fifty sixth transistor T56, a fifty seventh transistor T57 and a fifty eighth transistor T58, wherein:

a gate of the fifty fifth transistor T55, a drain of the fifty fifth transistor T55, a drain of the fifty seventh transistor T57 are electrically coupled to the second control end 6104 of the (N+4)th control circuit 601', i.e. receiving the second low frequency control signal LC2, and a source of the fifty fifth transistor T55 is electrically coupled to a drain of the fifty sixth transistor T56 and a gate of the fifty seventh transistor T57, and a gate of the fifty sixth transistor T56 is electrically coupled to the first control end Q(N+4) of the (N+4)th control circuit 601', and a source of the fifty seventh transistor T55 is electrically coupled to a drain of the fifty eighth transistor T58 and the output end P(N+4) of the (N+4)th control circuit 601', and a source of the fifty sixth transistor T56 and a source of the fifty eighth transistor T58 are inputted with the direct current low voltage Vss.

As the first control end Q(N+4) of the (N+4)th control circuit 601' is the high voltage level, the fifty sixth transistor T56 and the fifty eighth transistor T58 are activated, and the output end P(N+4) of the (N+4)th control circuit 601' is pulled down to be the high voltage level.

As the first control end Q(N+4) of the (N+4)th control circuit 601' is the low voltage level, and if the second low frequency control signal LC2 received by the second control end 6014 of the (N+4)th control circuit 601' is the high voltage level, the fifty fifth transistor T55 and the fifty seventh transistor T57 are activated, the output end P(N+4) of the (N+4)th control circuit 601' is the high voltage level.

As the first control end Q(N+4) of the (N+4)th control circuit is the low voltage level, and if the second low frequency control signal LC2 received by the second control end 6014 of the (N+4)th control circuit is changed from the high voltage level to the low voltage level, all the fifty fifth transistor T55, the fifty sixth transistor T56, the fifty seventh transistor T57 and the fifty eighth transistor T58 are deactivated, because the second low frequency control signal LC2 in the previous period is at the high voltage level and the output end P(N+4) of the (N+4)th control circuit 601' is high voltage level, the output end P(N+4) of the (N+4)th control circuit 601' is kept to be the voltage level state of the previous period, i.e. P(N+4) is the high voltage level.

Furthermore, the (N+4) holding circuit 602' comprises a thirty third transistor T33 and a forty third transistor T43, wherein:

a gate of the thirty third transistor T33 and a gate of the forty third transistor T43 are electrically coupled to the output end P(N+4) of the (N+4)th control circuit 601', and a drain of the thirty third transistor T33 is electrically coupled to the (N+4)th level scan line G(N+4), and a drain of the forty third transistor T43 is electrically coupled to the first control end Q(N+4) of the (N+4)th control circuit 601', and a source of the thirty third transistor T33 and a source of the forty third transistor T43 are inputted with the direct current low voltage Vss.

As the output end P(N+4) of the (N+4)th control circuit is the high voltage level, the thirty third transistor T33 and the forty third transistor T43 are activated to keep the (N+4)th level scan line G(N+4) and the first control end Q(N+4) of the (N+4)th control circuit 601' to be the low voltage levels.

Figure 4:
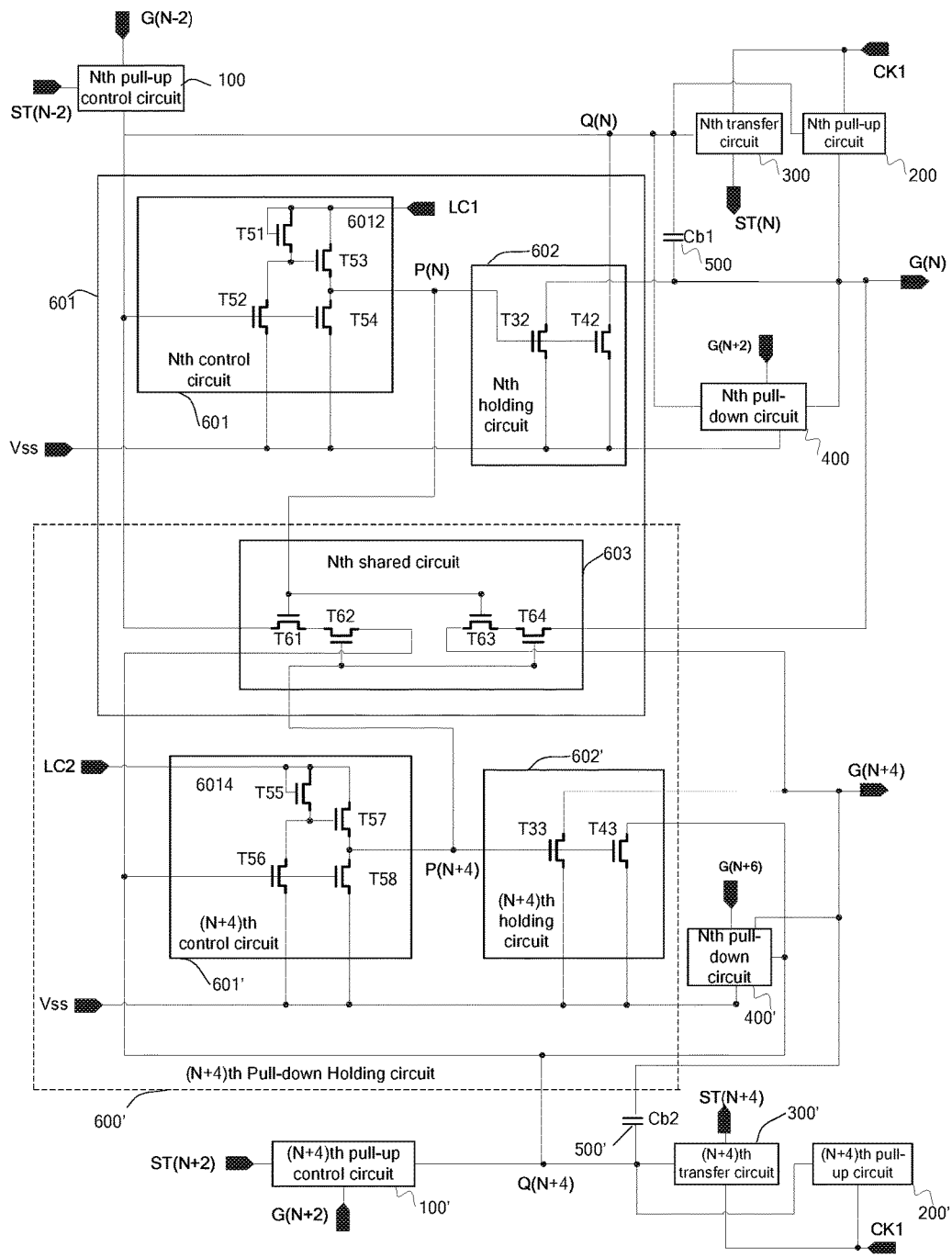
FIG. 4 is a diagram of another GOA circuit disclosed by the embodiment of the present invention.

Please refer to FIG. 4. FIG. 4 is a diagram of another GOA circuit disclosed by the embodiment of the present invention.

The Nth stage GOA unit further comprises a Nth pull-up control circuit 100, a Nth pull-up circuit 200, a Nth transfer circuit 300, a Nth pull-down circuit 400 and a Nth bootstrap capacitor 500. The Nth pull-up control circuit 100, the Nth pull-up circuit 200, the Nth transfer circuit 300, the Nth pull-down circuit 400 and the Nth bootstrap capacitor 500 are respectively coupled to the first control end Q(N) of the Nth control circuit 601, and the Nth pull-up circuit 200, the Nth pull-down circuit 400 and the Nth bootstrap capacitor 500 are electrically coupled to the Nth level scan line G(N), respectively.

The Nth pull-up control circuit 100 is electrically coupled to the first control end Q(N) of the Nth control circuit 601, and the Nth pull-up control circuit 100 receives a transfer signal ST(N−2) generated by the (N−2)th stage GOA unit and the (N−2)th level scan line G(N−2);

the Nth pull-up circuit 200 and the Nth transfer circuit 300 are electrically coupled to the first control end Q(N) of the Nth control circuit 601, respectively, and the Nth pull-up circuit 200 is electrically coupled to the Nth level scan line G(N), and the Nth transfer circuit 300 outputs a transfer signal ST(N) generated by the Nth stage GOA unit, and both the Nth pull-up circuit 200 and the Nth transfer circuit 300 receives a clock signal corresponding to the Nth stage GOA unit;

the Nth bootstrap capacitor 500 comprises a capacitor Cb1, and one end of the capacitor Cb1 is electrically coupled to the first control end Q(N) of the Nth control circuit 601, and the other end is electrically coupled to the Nth level scan line G(N);

the Nth pull-down circuit 400 is electrically coupled to the first control end Q(N) of the Nth control circuit 601 and the Nth level scan line G(N), respectively, and the Nth pull-down circuit 400 further receives the direct current low voltage Vss, and the Nth pull-down circuit 400 is further coupled to the (N+2)th level scan line G(N+2).

Similarly, in the (N+4)th stage GOA unit, the (N+4)th stage GOA unit further comprises a (N+4)th pull-up control circuit 100', a (N+4)th pull-up circuit 200', a (N+4)th transfer circuit 300', a (N+4)th pull-down circuit 400' and a (N+4)th bootstrap capacitor 500'. The (N+4)th pull-up control circuit 100', the (N+4)th pull-up circuit 200', the (N+4)th transfer circuit 300', the (N+4)th pull-down circuit 400' and the (N+4)th bootstrap capacitor 500' are respectively coupled to the first control end Q(N+4) of the (N+4)th control circuit 601', and the (N+4)th pull-up circuit 200', the (N+4)th pull-down circuit 400' and the (N+4)th bootstrap capacitor 500' are respectively coupled to the (N+4)th level scan line G(N+4).

The (N+4)th pull-up control circuit 100' receives a transfer signal ST(N+2) generated by the (N+2)th stage GOA unit and the (N+2)th level scan line G(N+2), and the (N+4)th pull-up control circuit is electrically coupled to the first control end Q(N+4) of the (N+4)th control circuit 601';

the (N+4)th pull-up circuit 200' and the (N+4)th transfer circuit 300' are electrically coupled to the first control end Q(N+4) of the (N+4)th control circuit 601', respectively, and the (N+4)th pull-up circuit 200' is electrically coupled to the (N+4)th level scan line G(N+4), and the (N+4)th transfer circuit 300' outputs a transfer signal ST(N+4) generated by the (N+4)th stage GOA unit, and both the (N+4)th pull-up circuit 200' and the (N+4)th transfer circuit 300' receives a clock signal corresponding to the (N+4)th stage GOA unit;

the (N+4)th bootstrap capacitor 500' comprises a capacitor Cb2, and one end of the capacitor Cb2 is electrically coupled to the (N+4)th gate signal point Q(N+4), and the other end is electrically coupled to the (N+4)th level scan line G(N+4);

the (N+4)th pull-down circuit 400' is electrically coupled to the first control end Q(N+4) of the (N+4)th control circuit 601' and the (N+4)th level scan line G(N+4), respectively, and the (N+4)th pull-down circuit 400' further receives the direct current low voltage Vss, and the (N+4)th pull-down circuit 400' is further coupled to the (N+6)th level scan line G(N+6).

A stage transfer employed by the GOA circuit is that the N−2th stage transfers signals to the Nth stage. The ST signal is the start signal of the GOA circuit, which is on only as the scan is starting, and at the low voltage level all the time thereafter. The ST signal is in charge of starting the first stage and the second stage GOA units, and the start signal of the following Nth stage GOA circuit is generated by the ST(N−2) signal of the transfer circuit part of the former N−2 stage circuit. Thus, the GOA drive circuit can be on stage by stage to achieve the row scan drive.

The Nth stage GOA unit receives the transfer signal ST(N−2) generated by the N−2th stage GOA unit, the scan drive signal G(N−2) generated by the N−2th stage GOA unit, the scan drive signal G(N+2) generated by the N+2th stage GOA unit, and the direct current voltage Vss, one CK signal in the clock signals CK1-CK4, and the Nth stage GOA unit outputs the scan drive signal G(N) and the transfer signal ST(N) via the different transistors. Such structure can ensure that the GOA signal is transferred stage by stage, and the respective scan lines are charged stage by stage. Because the transfer signal ST(N−2) of the (N−2)th stage GOA unit and the scan drive signal G(N−2) are outputted according to the same clock, the sequences and the voltage levels of ST(N−2) and G(N−2) are the same. In another embodiment of the present invention, the pull-up control circuit of the Nth stage GOA unit can receive either of the transfer signal ST(N−2) generated by the N−2th stage GOA unit and the scan drive signal G(N−2) generated by the N−2th stage GOA unit.

The GOA circuit comprises a plurality of GOA units, which are cascade coupled. The GOA circuit further comprises metal lines of the first low frequency control signal LC1, the second low frequency control signal LC2, the direct current low voltage VSS and the four clock signals CK1, CK2, CK3, CK4, which are located at the periphery of the respective GOA units.

In the GOA circuit, the clock signal is generally used to control on or off of the TFTs of each row. The clock signal is outputted to the level scan line of each GOA unit via the pull-up circuit. The various clock signals (such as CK-1, CK-2, CK-3 . . . CK-m) can be simultaneously outputted to the plurality of cascaded coupled GOA units included in the GOA circuit to output the clock signal to the gate of the TFT. For instance, the clock signals CK1, CK2, CK3, CK4 are respectively inputted to the pull-up circuits of the Nth, the N+1th, the N+2th, the N+3th stage GOA units to respectively charge the level scan lines corresponding to the display regions.

Figure 5:
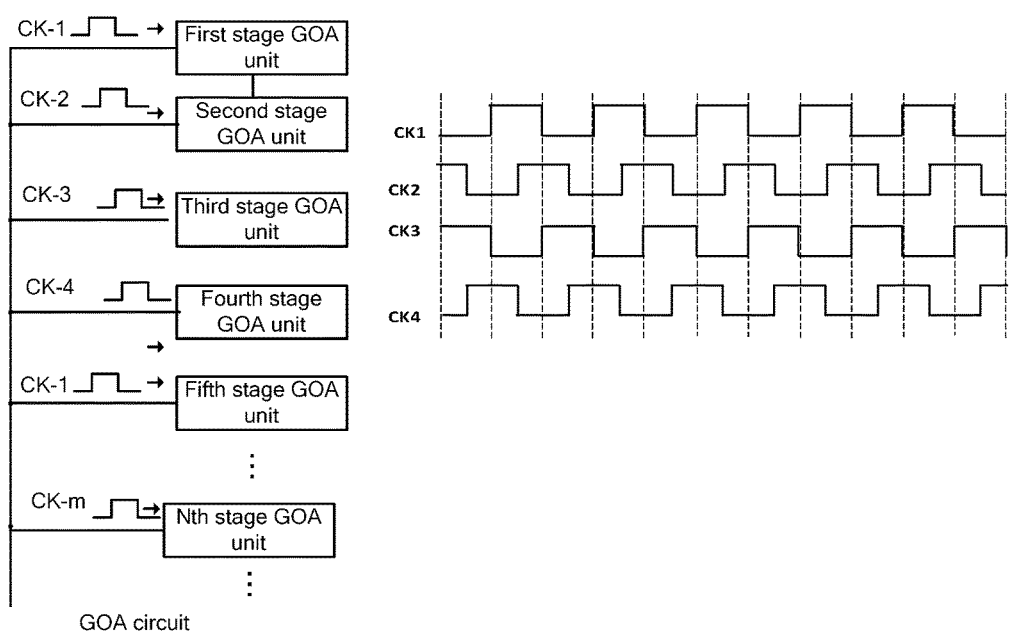
FIG. 5 is a sequence diagram of the clock signal in the embodiment of the present invention, and a relationship diagram of the clock signal and the respective GOA units.

FIG. 5 is a sequence diagram of the clock signal in the embodiment of the present invention, and a relationship diagram of the clock signal and the respective GOA units. In this embodiment, the clock signal received by each GOA unit is one of the first clock signal CK1, the second clock signal CK2, the third clock signal CK3 and the fourth clock signal CK4, wherein the first clock signal CK1 and the third clock signal CK3 are completely opposite. In sequence, the clock signals inputted to the Nth and the N+4th stage GOA units are just the same (please refer to the CK signal diagram of FIG. 5) so the mischarge issue generated by sharing the Q point can be prevented. The following is all introduced with illustration that the Nth stage GOA unit receives the clock signal CK1.

The first low frequency control signal LC1 and the second low frequency control signal LC2 are inverse in phase. The periods of LC1, LC2 are just the twice of the clock signal CK(m). The Duty Ratio of the CK signal is 50%.

Figure 6:
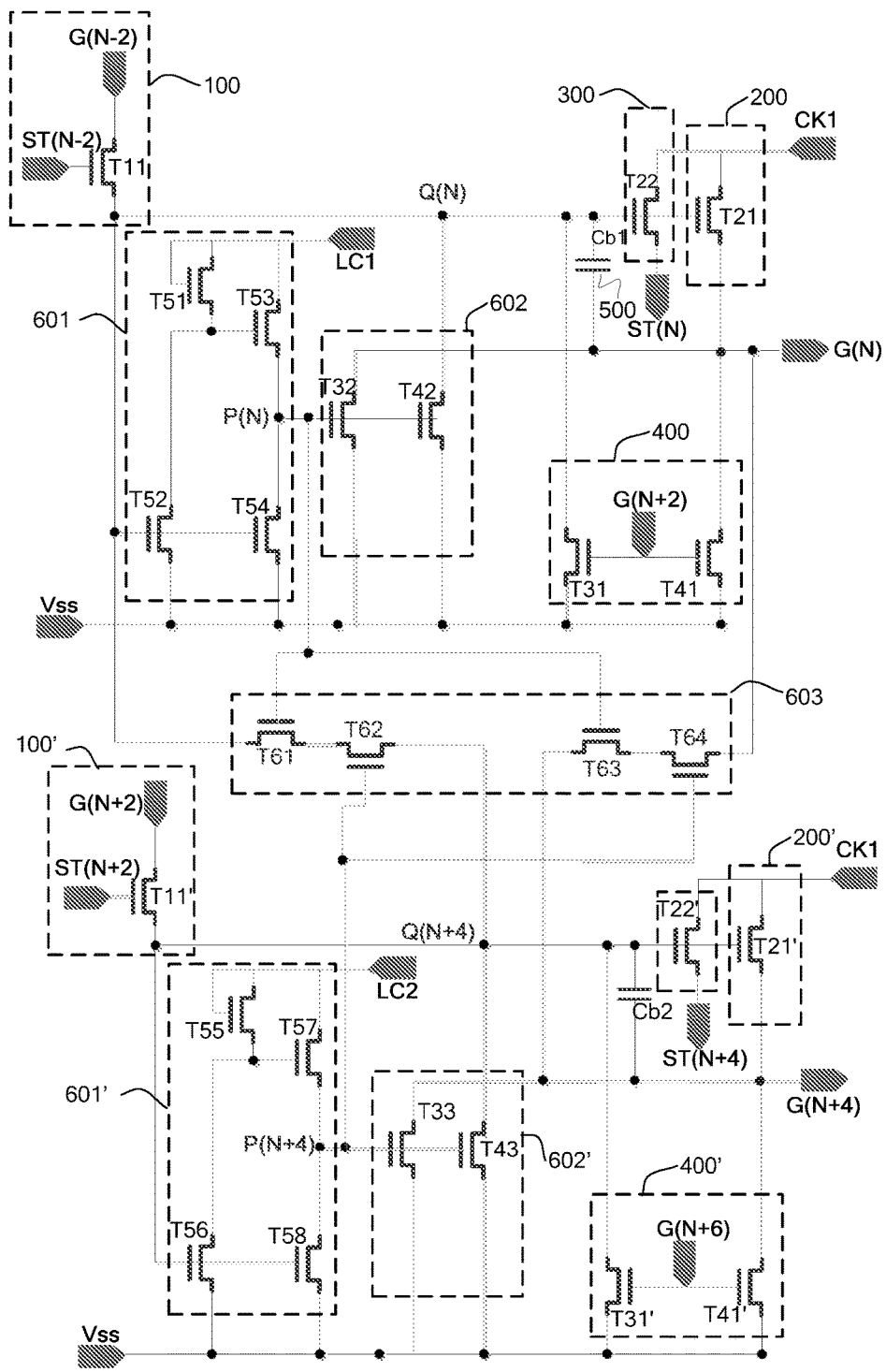
FIG. 6 is a diagram of another GOA circuit disclosed by the embodiment of the present invention.

Furthermore, please refer to FIG. 6. FIG. 6 is a diagram of the Nth stage GOA unit and the (N+4)th stage GOA unit in the GOA circuit disclosed by the embodiment of the present invention. As shown in FIG. 6, the circuit diagram of the (N+4)th stage GOA unit is similar with the structure of the Nth stage GOA unit. The detail can be referred to the related descriptions in FIG. 1-FIG. 4, and the repeated description is omitted here.

The structure of the Nth stage GOA unit further comprises: a Nth pull-up control circuit 100, a Nth pull-up circuit 200, a Nth transfer circuit 300, a Nth pull-down circuit 400, a Nth bootstrap capacitor 500 and a Nth pull-down holding circuit. The Nth pull-down holding circuit comprises a Nth control circuit 601, a Nth holding circuit 602 and a Nth shared circuit 603.

The shared circuit 603 comprises a sixty first transistor T61, a sixty second transistor T62, a sixty third transistor T63 and a sixty fourth transistor T64, wherein in the shared circuit, a gate of the sixty first transistor T61 and a gate of the sixty third transistor T63 are electrically coupled to the output end P(N) of the Nth control circuit 601 in the Nth stage GOA unit, and a source of the sixty first transistor T61 is electrically coupled to the first control end Q(N) of the Nth control circuit 601, and a drain of the sixty first transistor T61 is electrically coupled to a drain of the sixty second transistor T62; a source of the sixty second transistor T62 is electrically coupled to the first control end Q(N+4) of the (N+4)th control circuit 601' in the latter four stage GOA unit (i.e. the (N+4)th stage GOA unit) of the Nth stage GOA unit, and a gate of the sixty second transistor T62 and a gate of the sixty fourth transistor T64 are electrically coupled to the output end P(N+4) of the (N+4)th control circuit 601'; a source of the sixty third transistor T63 is electrically coupled to output end G(N+4) of the (N+4)th stage GOA unit i.e. the (N+4)th level scan line G(N+4), and a drain of the sixty third transistor T63 is electrically coupled to a drain of the sixty fourth transistor T64, and a drain of the sixty fourth transistor T64 is electrically coupled to the Nth level scan line G(N).

The Nth control circuit 601 comprises a fifty first transistor T51, a fifty second transistor T52, a fifty third transistor T53 and a fifty fourth transistor T54, wherein the fifty first transistor T51, in which both the gate and the drain are inputted with the first low frequency control signal LC1; the fifty second transistor T52, in which the gate is electrically coupled to the first control end Q(N) of the Nth control circuit 601, and the source is inputted with the direct current low voltage Vss; the fifty third transistor T53, in which the drain is inputted with the first low frequency control signal LC1, and the source is electrically coupled to the output end P(N) of the Nth control circuit 601, wherein the fifty first transistor T51, the drain of the fifty second transistor T52, the gate of the fifty third transistor T53 are electrically coupled together; the fifty fourth transistor T54, in which the gate is electrically coupled to the first control end Q(N) of the Nth control circuit 601, and the drain is electrically coupled to the output end P(N) of the Nth control circuit 601, and the source is inputted with the direct current low voltage Vss.

The Nth holding circuit 602 comprises a thirty second transistor T32 and a forty second transistor T42, wherein the thirty second transistor T32, in which the gate is electrically coupled to the output end P(N) of the Nth control circuit 601, and the drain is electrically coupled to the output end G(N) of the Nth stage GOA unit, and the source is inputted with the direct current low voltage Vss; the forty second transistor T42, in which the gate is electrically coupled to the output end G(N) of the Nth control circuit 601, and the drain is electrically coupled to the first control end Q(N) of the Nth control circuit 601, and the source is inputted with the direct current low voltage Vss.

The pull-down holding module 600 consisted of the Nth control circuit 601, the Nth holding circuit 602 and the Nth shared circuit 603 is mainly in charge of keeping the low voltage levels of Q(N) and G(N).

The Nth pull-up control circuit 100 comprises an eleventh transistor T11, and the gate of the eleventh thin film transistor T11 is inputted with the transfer signal ST(N−2) of the former two GOA unit ((N−2)th stage GOA unit) of the Nth stage GOA unit, and the drain and the source are electrically coupled to the (N−2)th level scan line G(N−2) and the first control end Q(N) of the Nth control circuit; the Nth pull-up control circuit 100 is employed to control the voltage level of Q(N).

The Nth pull-up circuit 200 comprises a twenty first transistor T21, in which the gate of the twenty first transistor T21 is electrically coupled to the first control end Q(N) of the Nth control circuit, and the drain receives the clock signal corresponding to the Nth stage GOA unit, and the source is electrically coupled to the Nth level scan line G(N), i.e. the output end G(N) of the Nth stage GOA unit. The Nth pull-up circuit 200 is employed to control the Nth stage GOA unit to output the scan drive signal G(N) according to the voltage level of the first control end Q(N) of the Nth control circuit and the voltage level of the clock signal received by the Nth stage GOA unit.

The Nth transfer circuit 300 comprises a twenty second transistor T22, in which the gate of the twenty second transistor T22 is electrically coupled to the first control en Q(N) of the Nth control circuit 601, and the drain receives the clock signal corresponding to the Nth stage GOA unit, and the source outputs the Nth transfer signal ST(N). The Nth transfer circuit 300 is employed to control the Nth stage GOA unit to output the Nth transfer signal ST(N) according to the voltage level of the first control end Q(N) of the Nth control circuit 601 and the voltage level of the clock signal received by the Nth stage GOA unit.

The Nth pull-down circuit 400 comprises a forty first transistor T41 and a thirty first transistor T31, and both gates of the forty first transistor T41 and the thirty first transistor T31 are electrically coupled to the output end G(N+2) of the latter two stage GOA unit (the N+2th stage GOA unit) of the Nth stage GOA unit, i.e. the (N+2)th level scan line G(N+2), and both the sources of the forty first transistor T41 and the thirty first transistor T31 are inputted with the direct current low voltage Vss, wherein the drain of T41 is electrically coupled to the Nth level scan line G(N), and the drain of the thirty first transistor T31 is electrically coupled to the first control end Q(N) of the Nth control circuit. The Nth pull-down circuit 400 is employed to rapidly pull down the voltage levels of the scan drive signal G(N) and the first control end Q(N) of the Nth control circuit 601 after outputting the scan drive signal G(N).

The Nth bootstrap capacitor 500 comprises a capacitor Cb1, and one end of the capacitor Cb1 is electrically coupled to the first control end Q(N) of the Nth control circuit 601, and the other end is electrically coupled to the Nth level scan line G(N). The bootstrap capacitor is in charge of the second boost to the Q(N).

Particularly, in the first stage GOA unit, both the gate and the drain of the eleventh transistor T11 in the pull-up control circuit receive the scan start signal ST, and only the twenty first transistor T21 output s the scan drive signal G(1) of the first stage GOA unit, and the source of the twenty second transistor T22 has no output, i.e. outputs the low voltage level.

Similarly, in the second stage GOA unit, both the gate and the drain of the eleventh transistor T11 in the pull-up control circuit receive the scan start signal ST, and only the twenty first transistor T21 output s the scan drive signal G(2) of the first stage GOA unit, and the source of the twenty second transistor T22 has no output, i.e. outputs the low voltage level.

Besides, in the last stage and the next to last stage GOA units, both gates of the forty first transistor T41 and the thirty first transistor T31 in the pull-down circuit receives the scan start signal ST.

According to the aforesaid circuit structure, the gates of the transistors T52, T54 are both coupled to the first control end Q(N) of the Nth control circuit 601, and sources are coupled to the direct current low voltage Vss, which is mainly to close the pull-down holding circuit as the Q(N) is the high voltage level to make P(N) at the low voltage level, and the gate of T51 is coupled to the first low frequency control signal LC1, and the source of T51 and the gate of T53 are coupled together, and the source of T53 is coupled to the output end P(N) of the Nth control circuit 601, which is mainly to activate T51, T53 with the high voltage level of LC1 as Q(N) is at the low voltage level to keep the low voltage levels of Q(N) and G(N) as P(N) is at the high voltage level; the transistor T31 is mainly to release the charge of Q(N); T41 is mainly to pull down G(N).

The Nth stage GOA unit G(N) and the (N+4)th stage GOA unit G(N+4) share the pull-down holding circuit, and the function of the shared circuit 603 is similar with an AND gate circuit. The Nth stage GOA unit G(N) has only one set of pull-down holding circuits to be provided with drive signal by the first low frequency control signal LC1; the (N+4)th stage GOA unit G(N+4) also has only one set of pull-down holding circuits to be provided with drive signal by the second low frequency control signal LC2.

Figure 7:
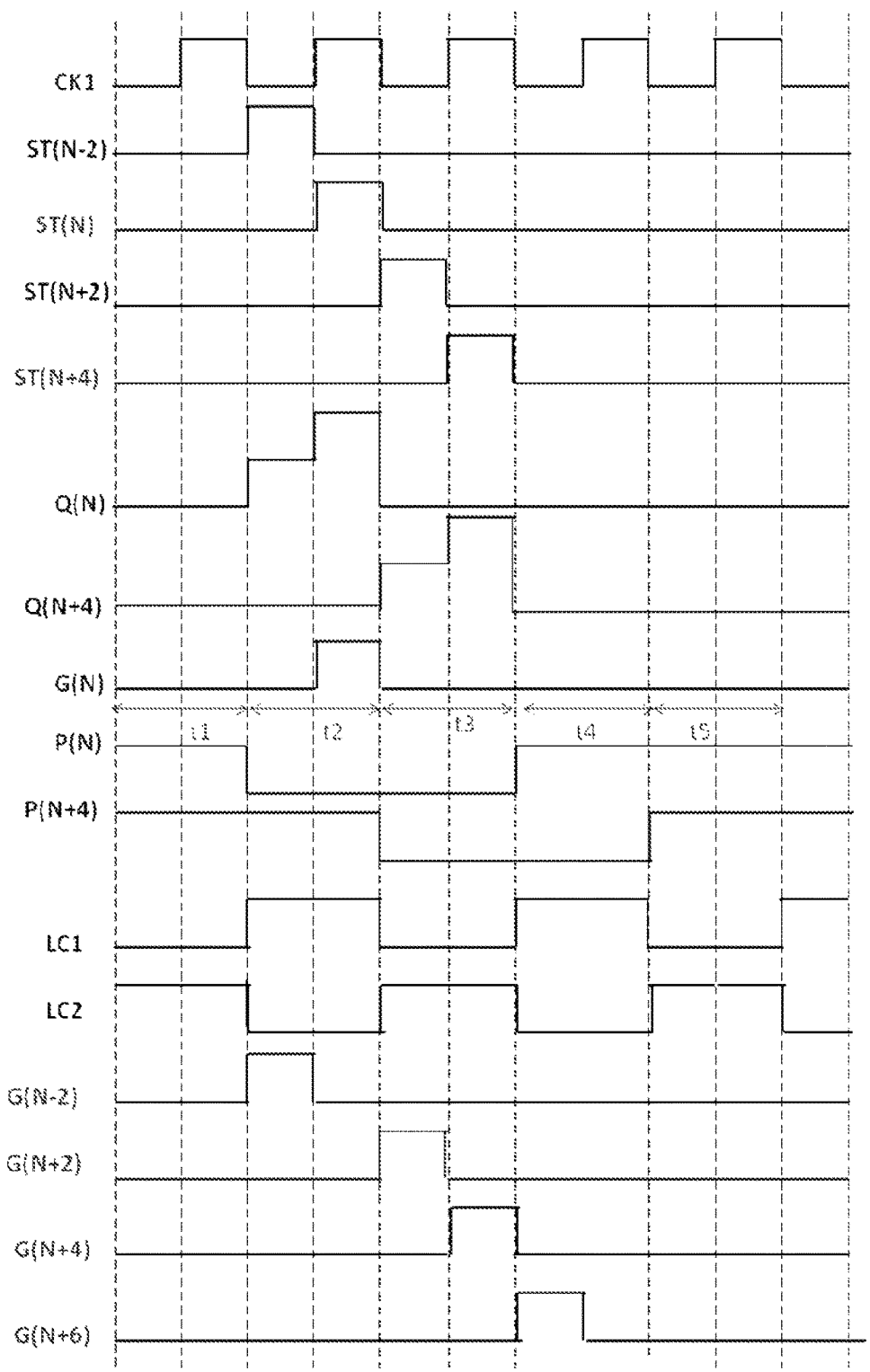
FIG. 7 is a waveform diagram of the input signal and the respective key nodes of the circuit structure shown in FIG. 6.

Based on the circuit shown in FIG. 6, FIG. 7 is a waveform diagram of the input signal and the respective key nodes of the circuit structure shown in FIG. 6. In FIG. 6, ST(N−2), ST(N), ST(N+2), ST(N+4) respectively are the transfer signals generated by the (N−2)th stage GOA unit, the Nth stage GOA unit, the (N+2)th stage GOA unit, the (N+4)th stage GOA unit.

The work conditions of the circuit is explained according to the five periods t1, t2, t3, t4, t5 in FIG. 7 one by one in the following:

In the period t1, the first low frequency control signal LC1 is at the low voltage level, and the second low frequency control signal LC2 is at the high voltage level; because the start signals ST(N−2), ST(N+2) of the Nth, the N+4th stage GOA units are not applied, both the first control end Q(N) of the Nth control circuit 601 and the first control end Q(N+4) of the (N+4)th control circuit 601' are at the low voltage level, and the Nth, the N+4th stage GOA units have not scan drive signals G(N) and G(N+4) for outputting, and both are at the low voltage level; because LC2 is at the high voltage level, the transistors T55, T57 in the (N+4)th stage GOA unit are activated, and the output end P(N+4) of the (N+4)th control circuit 601' is at the high voltage level, and the transistors T33, T43 are activated to keep Q(N+4) still at the low voltage level of Vss; for the Nth stage GOA unit, LC1 in the previous moment of t1 is also at the low voltage level to make P(N) at the high voltage level in the previous moment; although LC1 is at the low voltage level in the t1 moment, and P(N) point is still kept at the high voltage level of the previous moment because all the transistors T51, T52, T53, T54 are deactivated. Therefore, in the period t1, both P(N) and P(N+4) are at the high voltage level, and because both the gates of T61, T63 in the shared module are coupled to P(N), and both the gates of T62, T64 are coupled to P(N+4), all T61, T62, T63, T64 are activated to make Q(N) and Q(N+4) of the GOA units of the former and latter stages equipotential, and to make G(N) and G(N+4) equipotential, which are all kept at the low voltage level.

In the period t2, the start signal ST(N+2) of the (N+4)th stage GOA unit is constantly deactivated, and Q(N+4) and G(N+4) are constantly at the low voltage level; LC1 is at the high voltage level, and LC2 is at the low voltage level, and the Nth stage GOA unit receives the transfer signal ST(N−2) generated by the (N−2)th stage GOA unit, and ST(N−2) is first at the high voltage level, and then is at the low voltage level, and G(N−2) is synchronized with the signal ST(N−2), which is also first at the high voltage level, and then is at the low voltage level, but the CK1 signal is first at the low voltage level, and then is at the high voltage level.

As ST(N−2) in the period t2 is at the high voltage level, the transistor T1 in the Nth pull-up control circuit 100 is activated, and the high voltage level signal of G(N−2) is transmitted to the first control end Q(N) of the Nth control circuit 601, i.e. the Q(N) point is at the high voltage level because ST(N−2) is activated to charge the upper plate of the bootstrap capacitor Cb1. Because Q(N) is at the high voltage level, T22, T21 are activated, and the low voltage level signal of the clock signal CK1 outputs the Nth transfer signal ST(N) and the scan drive signal G(N) of low voltage level via T22, T21; besides, because Q(N) is at the high voltage level, the transistors T52, T54 are activated, and the P(N) point is pulled down to the low voltage level, and T61, T63 in the shared module are deactivated, the GOA units of the former and latter stages stop sharing, and then, because LC1 is the high voltage level in the previous moment of t2, P(N+4) is still kept at the high voltage level.

As ST(N−2) in the period t2 is at the low voltage level, although ST(N−2) is deactivated, and the transistor T11 is off, Q(N) is kept at the high voltage level with the bootstrap capacitor Cb1 which is previously full of charges to activate the transistors T22, T21, and meanwhile, the CK signal of high voltage level is inputted to the Nth stage GOA unit, and the Nth stage GOA unit outputs the Nth transfer signal ST(N) and the scan drive signal G(N) of high voltage level, i.e. the start signal is outputted to the (N+2)th stage GOA unit in the latter half of t2. Meanwhile, the CK1 signal of high voltage level keeps charging the bootstrap capacitor Cb1 to achieve the second boost to the Q(N) via the transistor T22. Therefore, in the entire period of t2, Q(N) is at the high voltage level. Similarly, in the latter half of t2, the (N+2)th stage GOA outputs G(N+2) of the low voltage level, and outputs G(N+2) and ST(N+2) of the high voltage level at the start moment of t3.

As the period t3 starts, G(N+2) starts to be on, and both the transistors T31, T41 are activated to rapidly pull the Nth level scan line G(N) of the Nth stage GOA unit to the low voltage level, and the high voltage level of the first control end Q(N) of the Nth control circuit 601 is pulled to the low voltage level which Vss is at, either, i.e. the high voltage level of the Q(N) point becomes the low voltage level because G(N+2) is pulled down, and then is kept at the low voltage level state, and in the period t3, LC1 is also the low voltage level, and T51, T53 are in the off state, the P(N) point is kept at the low voltage level of the period t2, and the AND gate circuit of the shared module remains not working. Then, Q(N+4) is at the high voltage level because ST(N+2), G(N+2) are activated to charge the upper plate of the capacitor Cb2, and besides, because Q(N+4) is at the high voltage level, and T22', T21' are activated, in the duration that ST(N+2) is activated, CK1 is at the low voltage level, and the (N+4)th stage GOA unit outputs the (N+4)th transfer signal ST(N+4) and the scan drive signal G(N+4) of the low voltage level; besides, because Q(N+4) is at the high voltage level, the transistors T56, T58 are activated, and P(N+4) is pulled to the low voltage level.

Here, ST(N+2) is activated for half time in the period t3, and as ST(N+2) in the period t3 is at the low voltage level, the CK1 signal of high voltage level is inputted to the (N+4)th stage GOA unit, and Cb2 which is previously full of charges still can activate the transistors T22', T21', and the (N+4)th stage GOA unit outputs the (N+4)th transfer signal ST(N+4) and the scan drive signal G(N+4) of the high voltage level, i.e. the (N+4)th level scan line outputs the high voltage level, and in the meantime, the CK1 signal of high voltage level in the (N+4)th stage GOA unit keeps charging the capacitor Cb2 via the transistor T22' to achieve the second boost to the voltage level of Q(N+4).

In the period t4, G(N+6) starts to be activated, and both the transistors T31' T41' are activated to rapidly pull the voltage level of the (N+4)th level scan line G(N+4) in the (N+4)th stage GOA unit to the low voltage level, the high voltage level of Q(N+4) is pulled down to be the low voltage level which Vss is at because G(N+6) is pulled down, and then is constantly kept at the low voltage level state; P(N+4) is still kept at the low voltage level of the period t3 because LC2 is at the low voltage level, and then the first low frequency control signal LC1 is at the high voltage level, the transistors T51, T53 are activated, and thus P(N) is at the high voltage level, and meanwhile, the transistors T32, T34 are also activated to keep Q(N) still at the low voltage level of Vss.

In the period t5, the first low frequency control signal LC1 is at the low voltage level, and the P(N) point is kept at the high voltage level of the period t4, and because the second low frequency control signal LC2 is changed to be the high voltage level, P(N+4) is also lifted to the high voltage level, and the transistors T33, T34 are activated, and Q(N+4) is still at the low voltage level of Vss; then, all the transistors T61, T62, T63, T64 in the shared circuit are activated, and the AND gate circuit starts to work, and the GOA circuits of the former and latter stages share the pull-down holding circuit to make Q(N) and Q(N+4) of the GOA units of the former and latter stages equipotential, and to make G(N) and G(N+4) equipotential, which are all kept at the low voltage level.

After the period t5 (from t5 to t2 of the next frame, wherein one frame means the time used to activate the first stage to the last stage GOA units stage by stage), and under the function of the first low frequency control signal LC1 and the second low frequency control signal LC2, which are inverse in phase, both P(N) and P(N+4) are at the high voltage level, and the shared module keeps to be at the on state of the period t5, and the Q(N) and Q(N+4) of the GOA units of the former and latter stages, G(N) and G(N+4) are alternately pulled down by LC1 and LC2 at the same time. Even the threshold voltages of these four transistors T61, T62, T63, T64 of the shared circuit have drift, it does not influence the operation that the GOA units of every two stages share the pull-down holding circuit because these mainly act to conduct the shared circuit.

Besides, according to the circuit structure in FIG. 7, because the shared pull-down holding part exists between the Nth stage GOA unit and the (N+4)th stage GOA unit, the GOA unit of each stage only requires 13 TFTs. For the GOA circuit comprising a plurality of GOA units, this can tremendously reduce the amount of TFTs in the GOA circuit to decrease the design space occupied by the GOA circuit for achieving the narrower frame design of the liquid crystal display.

Preferably, all the transistors in the aforesaid figures are N type metal oxide semiconductor (NMOS) transistors.

Selectably, the transistors in FIG. 6 can be replaced with the P type metal oxide semiconductor (PMOS) transistors. Correspondingly, the sequence diagram of the respective input signals has to be amended. The repeated description is omitted here.

The embodiment of the present invention further provides a liquid crystal display including the GOA circuit shown in any of FIG. 1 to FIG. 6. The GOA circuit can be referred to the aforementioned description shown in FIG. 1 to FIG. 6. The repeated description is omitted here.

In the description of the present specification, the reference terms, "one embodiment", "some embodiments", "an illustrative embodiment", "an example", "a specific example", or "some examples" mean that such description combined with the specific features of the described embodiments or examples, structure, material, or characteristic is included in the utility model of at least one embodiment or example. In the present specification, the terms of the above schematic representation do not certainly refer to the same embodiment or example. Meanwhile, the particular features, structures, materials, or characteristics which are described may be combined in a suitable manner in any one or more embodiments or examples.

The detail description has been introduced above for the GOA circuit and the liquid crystal display sharing the pull-down holding circuit which are provided by the embodiment of the invention. Herein, a specific case is applied in this article for explain the principles and specific embodiments of the present invention have been set forth. The description of the aforesaid embodiments is only used to help understand the method of the present invention and the core idea thereof; meanwhile, for those of ordinary skill in the art, according to the idea of the present invention, there should be changes either in the specific embodiments and applications but in sum, the contents of the specification should not be limitation to the present invention.

What is claimed is:

1. A Gate Driver On Array (GOA) circuit, wherein the GOA circuit comprises a plurality of GOA units which are cascade coupled, and the Nth stage GOA unit is employed to control charge to the Nth level scan line G(N), and the (N+4)th stage GOA unit is employed to control charge to the (N+4)th level scan line G(N+4), wherein N is a positive integer; wherein
the Nth stage GOA unit comprises a Nth Pull-down Holding circuit; the (N+4)th stage GOA unit comprises a (N+4)th Pull-down Holding circuit; the Nth Pull-down Holding circuit comprises a Nth control circuit, a Nth holding circuit and a Nth shared circuit, which is shared with the (N+4)th Pull-down Holding circuit; the (N+4)th Pull-down Holding circuit comprises a (N+4)th control circuit, a (N+4)th holding circuit and the Nth shared circuit, which is shared with the Nth Pull-down Holding circuit;
the Nth control circuit comprises a first control end Q(N) and a second control end, and the second control end of the Nth control circuit receives a first low frequency control signal, and the first control end Q(N) of the Nth control circuit and the first low frequency control signal are employed to control a voltage level of an output end P(N) of the Nth control circuit to be a high voltage level or a low voltage level; the Nth holding circuit is electrically coupled to the output end P(N), the first control end Q(N) of the Nth control circuit and the Nth level scan line G(N), and is employed to keep voltage levels of the first control end Q(N) of the Nth control circuit and the Nth level scan line G(N) to be low voltage levels as the output end P(N) of the Nth control circuit is the high voltage level;
the (N+4)th control circuit comprises a first control end Q(N+4) and a second control end, and the second control end of the (N+4)th control circuit receives a second low frequency control signal, and the first control end Q(N+4) of the (N+4)th control circuit and the second low frequency control signal are employed to control an output end P(N+4) of the (N+4)th control circuit to be a high voltage level or a low voltage level; the (N+4)th holding circuit is electrically coupled to the output end P(N+4), the first control end Q(N+4) of the (N+4)th control circuit and the (N+4)th level scan line G(N+4), and is employed to keep voltage levels of the first control end Q(N+4) of the (N+4)th control circuit and the (N+4)th level scan line G(N+4) to be low voltage levels as the output end P(N+4) of the (N+4)th control circuit is the high voltage level; wherein the first low frequency control signal and the second low frequency control signal are inverse in phase;
as the output end P(N) of the Nth control circuit is the high voltage level, and the output end P(N+4) of the (N+4)th control circuit is the high voltage level, the Nth shared circuit works to share the voltage levels of the first control end Q(N) of the Nth control circuit and the first control end Q(N+4) of the (N+4)th control circuit both kept to be the low voltage levels, and the Nth shared circuit shares the voltage levels of the Nth level scan line G(N) and the voltage level of the (N+4)th level scan line G(N+4) both kept to be the low voltage levels.

2. The GOA circuit according to claim 1, wherein as the output end P(N) of the Nth control circuit is the low voltage level, or the output end P(N+4) of the (N+4)th control circuit is the low voltage level, the Nth shared circuit stops working.

3. The GOA circuit according to claim 1, wherein the shared circuit comprises a sixty first transistor, a sixty second transistor, a sixty third transistor and a sixty fourth transistor, wherein:
a gate of the sixty first transistor and a gate of the sixty third transistor are electrically coupled to the output end P(N) of the Nth control circuit, and a source of the sixty first transistor is electrically coupled to the first control end Q(N) of the Nth control circuit, and a drain of the sixty first transistor is electrically coupled to a drain of the sixty second transistor; a source of the sixty second transistor is electrically coupled to the first control end Q(N+4) of the (N+4)th control circuit, and a gate of the sixty second transistor and a gate of the sixty fourth transistor are electrically coupled to the output end P(N+4) of the (N+4)th control circuit; a source of the sixty third transistor is electrically coupled to the (N+4)th level scan line G(N+4), and a drain of the sixty third transistor is electrically coupled to a drain of the sixty fourth transistor, and a drain of the sixty fourth transistor is electrically coupled to the Nth level scan line G(N).

4. The GOA circuit according to claim 3, wherein the Nth control circuit comprises a fifty first transistor, a fifty second transistor, a fifty third transistor and a fifty fourth transistor, wherein:
a gate of the fifty first transistor, a drain of the fifty first transistor, a drain of the fifty third transistor are electrically coupled to the second control end of the Nth control circuit, and a source of the fifty first transistor is electrically coupled to a drain of the fifty second transistor and a gate of the fifty third transistor, and a gate of the fifty second transistor is electrically coupled to the first control end Q(N) of the Nth control circuit, and a source of the fifty third transistor is electrically coupled to a drain of the fifty fourth transistor and the output end P(N) of the Nth control circuit, and a source of the fifty second transistor and a source of the fifty fourth transistor are inputted with a direct current low voltage;
as the first control end Q(N) of the Nth control circuit is the low voltage level, and if the second control end of the Nth control circuit is the high voltage level, the output end P(N) of the Nth control circuit is the high voltage level;
as the first control end Q(N) of the Nth control circuit is the low voltage level, and if the second control end of the Nth control circuit is changed from the high voltage level to the low voltage level, the output end P(N) of the Nth control circuit is the high voltage level.

5. The GOA circuit according to claim 4, wherein the Nth holding circuit comprises a thirty second transistor and a forty second transistor, wherein:
a gate of the thirty second transistor and a gate of the forty second transistor are electrically coupled to the output end P(N) of the Nth control circuit, and a drain of the thirty second transistor is electrically coupled to the Nth level scan line G(N), and a drain of the forty second transistor is electrically coupled to the first control end Q(N) of the Nth control circuit, and a source of the thirty second transistor and a source of the forty second transistor are inputted with the direct current low voltage;
as the output end P(N) of the Nth control circuit is the high voltage level, the Nth level scan line G(N) and the first control end Q(N) of the Nth control circuit are kept to be the low voltage levels.

6. The GOA circuit according to claim 3, wherein the (N+4)th control circuit comprises a fifty fifth transistor, a fifty sixth transistor, a fifty seventh transistor and a fifty eighth transistor, wherein:
a gate of the fifty fifth transistor, a drain of the fifty fifth transistor, a drain of the fifty seventh transistor are electrically coupled to the second control end of the (N+4)th control circuit, and a source of the fifty fifth transistor is electrically coupled to a drain of the fifty sixth transistor and a gate of the fifty seventh transistor, and a gate of the fifty sixth transistor is electrically coupled to the first control end Q(N+4) of the (N+4)th control circuit, and a source of the fifty seventh transistor is electrically coupled to a drain of the fifty eighth transistor and the output end P(N+4) of the (N+4)th control circuit, and a source of the fifty sixth transistor and a source of the fifty eighth transistor are inputted with the direct current low voltage;
as the first control end Q(N+4) of the (N+4)th control circuit is the low voltage level, and if the second control end of the (N+4)th control circuit is the high voltage level, the output end P(N+4) of the (N+4)th control circuit is the high voltage level;
as the first control end Q(N+4) of the (N+4)th control circuit is the low voltage level, and if the second control end of the (N+4)th control circuit is changed from the high voltage level to the low voltage level, the output end P(N+4) of the (N+4)th control circuit is the high voltage level.

7. The GOA circuit according to claim 6, wherein the (N+4) holding circuit comprises a thirty third transistor and a forty third transistor, wherein:
a gate of the thirty third transistor and a gate of the forty third transistor are electrically coupled to the output end P(N+4) of the (N+4)th control circuit, and a drain of the thirty third transistor is electrically coupled to the (N+4)th level scan line G(N+4), and a drain of the forty third transistor is electrically coupled to the first control end Q(N+4) of the (N+4)th control circuit, and a source of the thirty third transistor and a source of the forty third transistor are inputted with the direct current low voltage;
as the output end P(N+4) of the (N+4)th control circuit is the high voltage level, the (N+4)th level scan line G(N+4) and the first control end Q(N+4) of the (N+4)th control circuit are kept to be the low voltage levels.

8. The GOA circuit according to claim 3, wherein the Nth stage GOA unit further comprises a Nth pull-up control circuit, a Nth pull-up circuit, a Nth transfer circuit, a Nth pull-down circuit and a Nth bootstrap capacitor, wherein:
the Nth pull-up control circuit is electrically coupled to the first control end Q(N) of the Nth control circuit, and the Nth pull-up control circuit receives a transfer signal ST(N−2) generated by the (N−2)th stage GOA unit and the (N−2)th level scan line G(N−2);
the Nth pull-up circuit and the Nth transfer circuit are electrically coupled to the first control end Q(N) of the Nth control circuit, respectively, and the Nth pull-up circuit is electrically coupled to the Nth level scan line G(N), and the Nth transfer circuit outputs a transfer signal ST(N) generated by the Nth stage GOA unit, and both the Nth pull-up circuit and the Nth transfer circuit receives a clock signal corresponding to the Nth stage GOA unit;
one end of the Nth bootstrap capacitor is electrically coupled to the first control end Q(N) of the Nth control circuit, and the other end is electrically coupled to the Nth level scan line G(N);
the Nth pull-down circuit is electrically coupled to the first control end Q(N) of the Nth control circuit and the Nth level scan line G(N), respectively, and the Nth pull-down circuit further receives the direct current low voltage, and the Nth pull-down circuit is further coupled to the (N+2)th level scan line G(N+2).

9. The GOA circuit according to claim 3, wherein in the (N+4)th stage GOA unit: the (N+4)th stage GOA unit further comprises a (N+4)th pull-up control circuit, a (N+4)th pull-up circuit, a (N+4)th transfer circuit, a (N+4)th pull-down circuit and a (N+4)th bootstrap capacitor;

the (N+4)th pull-up control circuit receives a transfer signal ST(N+2) generated by the (N+2)th stage GOA unit and the (N+2)th level scan line G(N+2), and the (N+4)th pull-up control circuit is electrically coupled to the first control end Q(N+4) of the (N+4)th control circuit;

the (N+4)th pull-up circuit and the (N+4)th transfer circuit are electrically coupled to the first control end Q(N+4) of the (N+4)th control circuit, respectively, and the (N+4)th pull-up circuit is electrically coupled to the (N+4)th level scan line G(N+4), and the (N+4)th transfer circuit outputs a transfer signal ST(N+4) generated by the (N+4)th stage GOA unit, and both the (N+4)th pull-up circuit and the (N+4)th transfer circuit receives a clock signal corresponding to the (N+4)th stage GOA unit;

one end of the (N+4)th bootstrap capacitor is electrically coupled to the first control end Q(N+4) of the (N+4)th control circuit, and the other end is electrically coupled to the (N+4)th level scan line G(N+4);

the (N+4)th pull-down circuit is electrically coupled to the first control end Q(N+4) of the (N+4)th control circuit and the (N+4)th level scan line G(N+4), respectively, and the (N+4)th pull-down circuit further receives the direct current low voltage, and the (N+4)th pull-down circuit is further coupled to the (N+6)th level scan line G(N+6).

10. The GOA circuit according to claim 8, wherein the clock signal received by each GOA unit is one of a first clock signal, a second clock signal, a third clock signal and a fourth clock signal, wherein the clock signal received by the Nth stage GOA unit and the clock signal received by the (N+4)th stage GOA unit are the same.

11. The GOA circuit according to claim 10, wherein periods of the first low frequency control signal and the second low frequency control signal are twice of a period of the clock signal received by each GOA unit.

12. The GOA circuit according to claim 8, wherein in the first stage and the second stage GOA units, the first pull-up control circuit and the second pull-up control circuit receive a scan start signal; in the last stage and the next to last stage GOA units, the pull-down circuit receives the scan start signal.

13. A liquid crystal display, comprising a Gate Driver On Array (GOA) circuit, wherein the GOA circuit comprises a plurality of GOA units which are cascade coupled, and the Nth stage GOA unit is employed to control charge to the Nth level scan line G(N), and the (N+4)th stage GOA unit is employed to control charge to the (N+4)th level scan line G(N+4), wherein N is a positive integer; wherein the Nth stage GOA unit comprises a Nth Pull-down Holding circuit; the (N+4)th stage GOA unit comprises a (N+4)th Pull-down Holding circuit; the Nth Pull-down Holding circuit comprises a Nth control circuit, a Nth holding circuit and a Nth shared circuit, which is shared with the (N+4)th Pull-down Holding circuit; the (N+4)th Pull-down Holding circuit comprises a (N+4)th control circuit, a (N+4)th holding circuit and the Nth shared circuit, which is shared with the Nth Pull-down Holding circuit;

the Nth control circuit comprises a first control end Q(N) and a second control end, and the second control end of the Nth control circuit receives a first low frequency control signal, and the first control end Q(N) of the Nth control circuit and the first low frequency control signal are employed to control a voltage level of an output end P(N) of the Nth control circuit to be a high voltage level or a low voltage level; the Nth holding circuit is electrically coupled to the output end P(N), the first control end Q(N) of the Nth control circuit and the Nth level scan line G(N), and is employed to keep voltage levels of the first control end Q(N) of the Nth control circuit and the Nth level scan line G(N) to be low voltage levels as the output end P(N) of the Nth control circuit is the high voltage level;

the (N+4)th control circuit comprises a first control end Q(N+4) and a second control end, and the second control end of the (N+4)th control circuit receives a second low frequency control signal, and the first control end Q(N+4) of the (N+4)th control circuit and the second low frequency control signal are employed to control an output end P(N+4) of the (N+4)th control circuit to be a high voltage level or a low voltage level; the (N+4)th holding circuit is electrically coupled to the output end P(N+4), the first control end Q(N+4) of the (N+4)th control circuit and the (N+4)th level scan line G(N+4), and is employed to keep voltage levels of the first control end Q(N+4) of the (N+4)th control circuit and the (N+4)th level scan line G(N+4) to be low voltage levels as the output end P(N+4) of the (N+4)th control circuit is the high voltage level; wherein the first low frequency control signal and the second low frequency control signal are inverse in phase;

as the output end P(N) of the Nth control circuit is the high voltage level, and the output end P(N+4) of the (N+4)th control circuit is the high voltage level, the Nth shared circuit works to share the voltage levels of the first control end Q(N) of the Nth control circuit and the first control end Q(N+4) of the (N+4)th control circuit both kept to be the low voltage levels, and the Nth shared circuit shares the voltage levels of the Nth level scan line G(N) and the voltage level of the (N+4)th level scan line G(N+4) both kept to be the low voltage levels.

14. The liquid crystal display according to claim 13, wherein the shared circuit comprises a sixty first transistor, a sixty second transistor, a sixty third transistor and a sixty fourth transistor, wherein:

a gate of the sixty first transistor and a gate of the sixty third transistor are electrically coupled to the output end P(N) of the Nth control circuit, and a source of the sixty first transistor is electrically coupled to the first control end Q(N) of the Nth control circuit, and a drain of the sixty first transistor is electrically coupled to a drain of the sixty second transistor; a source of the sixty second transistor is electrically coupled to the first control end Q(N+4) of the (N+4)th control circuit, and a gate of the sixty second transistor and a gate of the sixty fourth transistor are electrically coupled to the output end P(N+4) of the (N+4)th control circuit; a source of the sixty third transistor is electrically coupled to the (N+4)th level scan line G(N+4), and a drain of the sixty third transistor is electrically coupled to a drain of the sixty fourth transistor, and a drain of the sixty fourth transistor is electrically coupled to the Nth level scan line G(N).

15. The liquid crystal display according to claim 14, wherein the Nth control circuit comprises a fifty first transistor, a fifty second transistor, a fifty third transistor and a fifty fourth transistor, wherein:

a gate of the fifty first transistor, a drain of the fifty first transistor, a drain of the fifty third transistor are electrically coupled to the second control end of the Nth control circuit, and a source of the fifty first transistor is electrically coupled to a drain of the fifty second transistor and a gate of the fifty third transistor, and a gate of the fifty second transistor is electrically coupled to the first control end Q(N) of the Nth control circuit, and a source of the fifty third transistor is electrically coupled to a drain of the fifty fourth transistor and the output end P(N) of the Nth control circuit, and a source of the fifty second transistor and a source of the fifty fourth transistor are inputted with a direct current low voltage;

as the first control end Q(N) of the Nth control circuit is the low voltage level, and if the second control end of the Nth control circuit is the high voltage level, the output end P(N) of the Nth control circuit is the high voltage level;

as the first control end Q(N) of the Nth control circuit is the low voltage level, and if the second control end of the Nth control circuit is changed from the high voltage level to the low voltage level, the output end P(N) of the Nth control circuit is the high voltage level.

16. The liquid crystal display according to claim 15, wherein the Nth holding circuit comprises a thirty second transistor and a forty second transistor, wherein:

a gate of the thirty second transistor and a gate of the forty second transistor are electrically coupled to the output end P(N) of the Nth control circuit, and a drain of the thirty second transistor is electrically coupled to the Nth level scan line G(N), and a drain of the forty second transistor is electrically coupled to the first control end Q(N) of the Nth control circuit, and a source of the thirty second transistor and a source of the forty second transistor are inputted with the direct current low voltage;

as the output end P(N) of the Nth control circuit is the high voltage level, the Nth level scan line G(N) and the first control end Q(N) of the Nth control circuit are kept to be the low voltage levels.

17. The liquid crystal display according to claim 14, wherein the (N+4)th control circuit comprises a fifty fifth transistor, a fifty sixth transistor, a fifty seventh transistor and a fifty eighth transistor, wherein:

a gate of the fifty fifth transistor, a drain of the fifty fifth transistor, a drain of the fifty seventh transistor are electrically coupled to the second control end of the (N+4)th control circuit, and a source of the fifty fifth transistor is electrically coupled to a drain of the fifty sixth transistor and a gate of the fifty seventh transistor, and a gate of the fifty sixth transistor is electrically coupled to the first control end Q(N+4) of the (N+4)th control circuit, and a source of the fifty seventh transistor is electrically coupled to a drain of the fifty eighth transistor and the output end P(N+4) of the (N+4)th control circuit, and a source of the fifty sixth transistor and a source of the fifty eighth transistor are inputted with the direct current low voltage;

as the first control end Q(N+4) of the (N+4)th control circuit is the low voltage level, and if the second control end of the (N+4)th control circuit is the high voltage level, the output end P(N+4) of the (N+4)th control circuit is the high voltage level;

as the first control end Q(N+4) of the (N+4)th control circuit is the low voltage level, and if the second control end of the (N+4)th control circuit is changed from the high voltage level to the low voltage level, the output end P(N+4) of the (N+4)th control circuit is the high voltage level.

18. The liquid crystal display according to claim 17, wherein the (N+4) holding circuit comprises a thirty third transistor and a forty third transistor, wherein:

a gate of the thirty third transistor and a gate of the forty third transistor are electrically coupled to the output end P(N+4) of the (N+4)th control circuit, and a drain of the thirty third transistor is electrically coupled to the (N+4)th level scan line G(N+4), and a drain of the forty third transistor is electrically coupled to the first control end Q(N+4) of the (N+4)th control circuit, and a source of the thirty third transistor and a source of the forty third transistor are inputted with the direct current low voltage;

as the output end P(N+4) of the (N+4)th control circuit is the high voltage level, the (N+4)th level scan line G(N+4) and the first control end Q(N+4) of the (N+4)th control circuit are kept to be the low voltage levels.

19. The liquid crystal display according to claim 14, wherein the Nth stage GOA unit further comprises a Nth pull-up control circuit, a Nth pull-up circuit, a Nth transfer circuit, a Nth pull-down circuit and a Nth bootstrap capacitor, wherein:

the Nth pull-up control circuit is electrically coupled to the first control end Q(N) of the Nth control circuit, and the Nth pull-up control circuit receives a transfer signal ST(N−2) generated by the (N−2)th stage GOA unit and the (N−2)th level scan line G(N−2);

the Nth pull-up circuit and the Nth transfer circuit are electrically coupled to the first control end Q(N) of the Nth control circuit, respectively, and the Nth pull-up circuit is electrically coupled to the Nth level scan line G(N), and the Nth transfer circuit outputs a transfer signal ST(N) generated by the Nth stage GOA unit, and both the Nth pull-up circuit and the Nth transfer circuit receives a clock signal corresponding to the Nth stage GOA unit;

one end of the Nth bootstrap capacitor is electrically coupled to the first control end Q(N) of the Nth control circuit, and the other end is electrically coupled to the Nth level scan line G(N);

the Nth pull-down circuit is electrically coupled to the first control end Q(N) of the Nth control circuit and the Nth level scan line G(N), respectively, and the Nth pull-down circuit further receives the direct current low voltage, and the Nth pull-down circuit is further coupled to the (N+2)th level scan line G(N+2).

20. The liquid crystal display according to claim 14, wherein in the (N+4)th stage GOA unit: the (N+4)th stage GOA unit further comprises a (N+4)th pull-up control circuit, a (N+4)th pull-up circuit, a (N+4)th transfer circuit, a (N+4)th pull-down circuit and a (N+4)th bootstrap capacitor;

the (N+4)th pull-up control circuit receives a transfer signal ST(N+2) generated by the (N+2)th stage GOA unit and the (N+2)th level scan line G(N+2), and the (N+4)th pull-up control circuit is electrically coupled to the first control end Q(N+4) of the (N+4)th control circuit;

the (N+4)th pull-up circuit and the (N+4)th transfer circuit are electrically coupled to the first control end Q(N+4) of the (N+4)th control circuit, respectively, and the (N+4)th pull-up circuit is electrically coupled to the (N+4)th level scan line G(N+4), and the (N+4)th transfer circuit outputs a transfer signal ST(N+4) generated by the (N+4)th stage GOA unit, and both the (N+4)th pull-up circuit and the (N+4)th transfer circuit receives a clock signal corresponding to the (N+4)th stage GOA unit;

one end of the (N+4)th bootstrap capacitor is electrically coupled to the first control end Q(N+4) of the (N+4)th control circuit, and the other end is electrically coupled to the (N+4)th level scan line G(N+4);

the (N+4)th pull-down circuit is electrically coupled to the first control end Q(N+4) of the (N+4)th control circuit and the (N+4)th level scan line G(N+4), respectively, and the (N+4)th pull-down circuit further receives the direct current low voltage, and the (N+4)th pull-down circuit is further coupled to the (N+6)th level scan line G(N+6).

* * * * *